United States Patent
Kimura et al.

(10) Patent No.: US 6,518,962 B2
(45) Date of Patent: *Feb. 11, 2003

(54) PIXEL CIRCUIT DISPLAY APPARATUS AND ELECTRONIC APPARATUS EQUIPPED WITH CURRENT DRIVING TYPE LIGHT-EMITTING DEVICE

(75) Inventors: Mutsumi Kimura, Suwa; Tatsuya Shimoda, Nagano; Hiroshi Kiguchi, Suwa-shi, all of (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/171,526

(22) PCT Filed: Mar. 6, 1998

(86) PCT No.: PCT/JP98/00971

§ 371 (c)(1),
(2), (4) Date: Oct. 21, 1998

(87) PCT Pub. No.: WO98/40871

PCT Pub. Date: Sep. 17, 1998

(65) Prior Publication Data

US 2002/0180721 A1 Dec. 5, 2002

(30) Foreign Application Priority Data

Mar. 12, 1997 (JP) ................................. 9-057858
Aug. 28, 1997 (JP) ................................. 9-233108

(51) Int. Cl.[7] ................................................ G09G 5/00
(52) U.S. Cl. ...................................... 345/211; 345/214
(58) Field of Search ................................. 345/202, 211, 345/212, 214; 315/159, 167

(56) References Cited

U.S. PATENT DOCUMENTS

| 5,093,654 A | 3/1992 | Swift et al. ................. 340/781 |
| 5,235,253 A | 8/1993 | Sato ........................ 315/169.3 |
| 5,323,408 A | 6/1994 | Hahn et al. .................... 372/29 |

(List continued on next page.)

FOREIGN PATENT DOCUMENTS

| DE | 3726243 A1 | 2/1989 |
| EP | 466 506 A2 | 1/1992 |
| JP | A-61-45281 | 3/1986 |

(List continued on next page.)

OTHER PUBLICATIONS

Yuji Hamada et al. "Influence of the Emission Site on the Running Durability of Organic Electroluminescent Devices", vol. 34 (1995) pp. L 824–L 826, Part 2, No. 7A, Jul. 1, 1995.

Primary Examiner—Amare Mengistu
(74) Attorney, Agent, or Firm—Oliff & Berridge, PLC

(57) ABSTRACT

A display apparatus is provided with a current driving type light-emitting device and a driving device for controlling a driving current flowing through the light-emitting device for each pixel of the display apparatus. The display apparatus consists of power source units for supplying power for causing a driving current to flow via the driving device to the light-emitting device via a power source wire, and signal wire driving units for supplying a data signal to the driving device via signal wires. In addition, voltage adjusting units adjust a voltage for the power source units or a data signal from the signal wire driving units so that a quantity of a driving current flowing through the light emitting device when a data signal of a predetermined voltage is supplied to the driving device via signal wires or a quantity of emitted light emitted from the light-emitting device comes close to a predetermined reference value.

20 Claims, 21 Drawing Sheets

U.S. PATENT DOCUMENTS

| | | | | |
|---|---|---|---|---|
| 5,386,179 A | | 1/1995 | Sato | 315/169.3 |
| 5,463,279 A | | 10/1995 | Khormaei | 315/169.3 |
| 5,581,159 A | * | 12/1996 | Lee et al. | 315/167 |
| 5,594,463 A | | 1/1997 | Sakamoto | 345/76 |
| 5,783,909 A | * | 7/1998 | Hochstein | 315/159 |
| 5,940,058 A | * | 8/1999 | Koyama | 345/89 |
| 5,962,845 A | * | 10/1999 | Yee | 250/214 R |

FOREIGN PATENT DOCUMENTS

| | | |
|---|---|---|
| JP | A-4-269790 | 9/1992 |
| JP | A-5-19234 | 1/1993 |
| JP | A-8-54835 | 2/1996 |
| JP | A-8-227276 | 9/1996 |
| JP | A-9-64365 | 3/1997 |

\* cited by examiner

PIXEL CIRCUIT DISPLAY APPARATUS AND ELECTRONIC APPARATUS EQUIPPED WITH CURRENT DRIVING TYPE LIGHT-EMITTING DEVICE

BACKGROUND OF THE INVENTION

1. Field of the Invention

The present invention relates to a pixel circuit which has a current driving type light-emitting device such as an organic electroluminescent device (hereinafter, called "organic EL device") and a driving device such as a thin film transistor for driving the current driving type light-emitting device. The present invention also relates to a display apparatus having pixels, each pixel being provided with such a pixel circuit, and further to an electronic apparatus having the same. In particular, the present invention concerns a driving circuit, as well as a display apparatus, capable of compensating for deterioration with time of the current driving type light-emitting device and the driving device, as well as to an electronic device incorporating such a driving circuit and a display apparatus.

2. Description of Related Art

As an example of such a display apparatus, a display apparatus of the type using a Thin Film Transistor (hereinafter abbreviated as a TFT) for driving a current driving type light-emitting device such as an organic EL device as a driving device is configured as will be described. That is, a data signal and a scanning signal, each corresponding to an image to be displayed, are respectively supplied to a signal line and a scanning line provided in a display region from a scanning line driving circuit and a signal line driving circuit. On the other hand, a voltage is applied between a pixel electrode and an opposing electrode at each pixel through a driving TFT provided for each of a plurality of matrix pixels in a display region from a common electrode driving circuit and an opposing electrode driving circuit. Then, a current flowing through a current driving type light-emitting device arranged between the pixel electrode and the opposing electrode is controlled by the TFT for driving each pixel in accordance with a data signal voltage supplied from the signal line at the same time as a scanning signal is supplied from the scanning line.

More specifically, for example, a switching TFT is provided for each pixel for supplying a data signal from the signal line to a gate of the driving TFT through a source and a drain when a scanning signal is supplied from the scanning line to the gate. The conductance between the source and the drain of the driving TFT is controlled (changed) according to a voltage (i.e., a gate voltage) of a data signal supplied to the gate. At this time, the gate voltage is retained for a longer time than the period that the data signal is supplied by a retention capacitor connected to the gate. In addition, a driving current is supplied to an organic EL device, etc. through the source and the drain whose conductance is thus controlled, thereby driving the organic EL device in accordance with a driving current.

Especially, the organic EL device equipped with the driving TFT described above is considered promising as a current control type light-emitting device (hereinafter, described as "TFT-OELD") for realizing a display panel featuring a large size, highly resolution, a wide viewing angle, and low power consumption.

However, for a current driving type light-emitting device such as an organic EL device, a driving current flows through the inside of the device, so that deterioration over time occurs irrespective of scale. For example, with respect to the organic EL device, it has been reported that significant deterioration over time occurs. (Refer to Jpn. J. Appl. Phys., 34, L824 (1995)). The deterioration of the organic EL device over time is broadly classified into two types. One of them is a reduction in current against a voltage applied to the organic EL device. The other is a reduction in a quantity of emitted light against a given voltage applied to the organic EL device or a current flowing therethrough. Additionally, the degree of deterioration over time varies among each organic EL device. Further, for a TFT-OELD, the TFT deteriorates over time because of a current flowing through the TFT as a driving device. For this reason, in a display apparatus employing the TFT-OELD, a problem of deterioration in image quality arises when the organic EL device or the driving TFT deteriorates over time. That is, deterioration in current decrease or a quantity of emitted light decrease leads to degradation of screen luminance, while variation in these decreases cause screen irregularities. Especially, these kinds of deterioration occur depending upon luminescence characteristics of the organic EL device during manufacture, variations in current-voltage characteristics or threshold characteristics of the driving TFT or history of display patterns, and so forth, thus resulting in deterioration in screen quality of an entire display apparatus, and screen irregularities.

In this connection, Japanese Patent Publication No. 05-019234 discloses a conventional art that an EL device is used as a rear light source (backlight) of a liquid crystal display panel to thereby detect the luminance of the EL device in such a manner that the luminance of an entire liquid crystal display panel lightened from the rear by the EL device does not decrease, thereby correcting for deterioration of the rear light source. However, the conventional art relates to an entire liquid crystal display panel, and an EL device is not provided for each pixel as a display device, and is used merely as a rear light source. Therefore, the conventional art substantially differs from the present invention in its applicability. Additionally, the conventional art does not suggest an effective technology for correcting deterioration over time described above in a display apparatus having each pixel equipped with a current driving type light-emitting device such as an organic EL device. Furthermore, the technical problems of increasing the longevity of a display apparatus or improving the display quality by correcting for deterioration over time in a driving TFT or a current driving type light-emitting device in a display apparatus equipped with a current driving light-emitting device at each pixel is not recognized between and by those skilled in the art.

SUMMARY OF THE INVENTION

In view of the above-described problems, to solve the technical problems described above, it is an object of the present invention to provide a pixel circuit, a display apparatus and an electronic apparatus equipped with a current driving type light-emitting device which is capable of reducing degradation of screen luminance or screen irregularities by appropriately correcting for deterioration over time when deterioration over time causes a reduced current or a reduced quantity of emitted light or dispersion of deterioration over time in a current driving light-emitting device.

(1) To solve the problems described above, the present invention provides a first display apparatus comprising: a current driving type light-emitting device provided for each pixel; a driving device provided for each the pixel, for controlling a driving current flowing to the light-emitting device according to a voltage of a data signal; a power source unit for supplying power source voltage through a power wire to cause the driving current to flow through the light-emitting device via the driving device; a signal wire driving unit for supplying the data signal to the driving device through a signal wire; and a voltage adjusting unit for adjusting at least one of the power source voltage of the power source unit and the data signal at the signal wire driving unit, in such a manner that, when a data signal of a predetermined voltage is supplied to the driving device through the signal wire, at least one of a quantity of driving current flowing and a quantity of light emitted by the light-emitting device approaches a predetermined reference value.

In the first display apparatus as defined above, a driving current flows to the light-emitting device via the driving device, as the power source voltage is supplied from the power source unit, while the driving device is supplied with a data signal from the signal wire driving unit via a signal wire. The driving current flowing through the light-emitting device is controlled by the driving device in accordance with a voltage of the data signal. As a consequence, the current driving type light-emitting device emits light by the driving current, in accordance with a voltage of the data signal. When a data signal of a predetermined voltage is supplied to the driving device through the signal line in, for example, a non-display period, the voltage adjusting unit serves to control at least one of the power source voltage at the power source unit and the voltage of the data signal at the signal wire driving unit, in such a manner that a quantity of driving current flowing through the light-emitting device or a quantity of light emitted from the light-emitting device approaches a predetermined reference value( i.e., a reference current or a reference light quantity).

Hence, even if a light-emitting device or a driving current is impeded as a result of deterioration over time of the light-emitting device or the driving device which causes increase in a resistance of the light-emitting device or the driving device, a quantity of driving current or a quantity of light emitted in the corresponding light-emitting device is maintained substantially constant. Thus, any decrease in the quantity of driving current or the quantity of emitted light, attributable to deterioration over time of the light-emitting device or the driving device, can be appropriately compensated for by carrying out voltage adjustment.

Further, even if there are variations in current-voltage characteristics or current-light emitting characteristics of the light-emitting device or the driving device among a plurality of pixels, the quantity of driving current or the quantity of emitted light in the light-emitting device of the corresponding plurality of pixels can be substantially equalized, if the voltage control by the voltage adjusting unit is performed on independent pixels. That is to say, variations of a quantity of driving current and a quantity of emitted light, attributable to the variations in the characteristics of the light-emitting device or the driving device, can effectively be corrected.

Thus, according to the first display apparatus, in a display apparatus in which the current driving type light-emitting device such as an organic EL device is driven by the driving device such as a thin film transistor, a decrease in screen luminance and screen irregularities caused by deterioration over time or variations in characteristics in each device can be reduced.

(2) In one form of the first display apparatus, the driving device comprises a thin film transistor having a gate to which the data signal is supplied, and a source and a drain between which the driving current flows, a conductance between the source and the drain being controlled by a gate voltage.

In this form of this display apparatus, the conductance between the source and the drain is controlled (changed) in accordance with the data signal supplied to the gate of the thin film transistor. It is therefore possible to control the driving current flowing through the source and the drain to the light-emitting device, in accordance with the voltage of the data signal.

(3) In another form of the first display apparatus, the voltage adjusting unit comprises: a current measuring unit for measuring a quantity of driving current when a data signal of the predetermined voltage is supplied to the driving device; and a voltage control unit for adjusting at least one of the voltages such that the measured current approaches a predetermined reference current.

In this form of this display apparatus, a quantity of driving current is measured by the current measuring unit when the data signal of a predetermined voltage is supplied to the driving device. Additionally, the voltage of the data signal or the power source voltage of the driving current is adjusted by the voltage controlling unit in such a manner that the current thus measured comes close to a predetermined reference current.

Thus, even if a driving current is impeded as a result of deterioration over time of the light-emitting device or the driving device which causes an increase in a resistance of the light-emitting device or the driving device, a quantity of driving current in the corresponding light-emitting device is maintained substantially constant. Further, even if there are variations in current-voltage characteristics of the light-emitting device or the driving device among a plurality of pixels, the quantity of driving current in the light-emitting device of the corresponding plurality of pixels can be maintained substantially constant, if the voltage control of the data signal by the voltage adjusting unit is performed on independent pixels.

(4) In still another form of the first display apparatus, the voltage adjusting unit comprises: a light-emitting measuring unit for measuring the quantity of the emitted light at the time when a data signal of the predetermined voltage is supplied to the driving device; and a voltage control unit for adjusting at least one of the voltages such that the measured quantity of emitted light approaches the reference quantity of emitted light.

According to this form of this display apparatus, a quantity of light emitted from the light-emitting device obtained by supplying a data signal of a predetermined voltage to the driving device is measured by a emitted light quantity measuring unit. A voltage of the data signal or power source voltage for driving current is controlled by the voltage controlling unit in such a manner that the measured light quantity comes close to the predetermined reference light quantity.

Thus, even if a light-emitting device is impeded as a result of deterioration over time of the light-emitting device or the driving device which causes an increase in a resistance of the light-emitting device or the driving device, a quantity of light emitted from the light-emitting device is maintained substantially constant. Further, even if there are variations in current-voltage characteristics or current-light emitting characteristics of the light-emitting device or the driving device among a plurality of pixels, the quantity of driving current in the light-emitting device of the corresponding plurality of pixels can be maintained substantially constant, if the voltage control of the data signal by the voltage adjusting unit is performed on independent pixels.

(5) In a further form of the first display apparatus, a controller is further provided for controlling the voltage adjusting unit so as to adjust at least one of the voltages at a non-display period prior to a display period.

In this form of this apparatus, the voltage of data signal or power source voltage for the driving current is controlled by the voltage adjusting unit under the control of a controller at a non-display period preceding a display period. As a result, it is not necessary to occupy part of the display period for the purpose of measurement. In addition, the voltage control operation is carried out by the voltage adjusting unit, without affecting the screen display at a display period. Additionally, often it is enough to carry out the adjusting operation by the voltage adjusting unit at each non-display period such as at power-up.

(6) To solve the technical problems described above, a second display apparatus in accordance with the present invention comprises: a current driving type display light-emitting device provided for each pixel of a display region; a driving device provided for each the pixel, for controlling a driving current flowing to the display light-emitting device according to a voltage of a data signal; a power source unit for supplying a power source voltage through a power wire to cause the driving current to flow to the display light-emitting device via the driving device; a signal wire driving unit for supplying the data signal to the driving device through a signal wire; a current driving type monitoring light-emitting device provided in a monitoring region and driven by current in the same manner as the display light-emitting device; and a voltage adjusting unit for adjusting at least one of the power supply of the power source unit and the data signal at the signal wire driving unit, in such a manner that at least one of a quantity of driving current flowing and a quantity of light emitted by the monitoring light-emitting device comes close to a predetermined reference value.

In the second display apparatus as defined above, a driving current flows to the display light-emitting device via the driving device, as the power source voltage is supplied from the power source unit, while the driving device is supplied with a data signal from the signal wire driving unit through the signal wire. The driving current flowing through the display light-emitting device is controlled by the driving device in accordance with a voltage of the data signal. As a consequence, the current driving type display light-emitting device emits light by the driving current, in accordance with the voltage of the data signal. When a data signal of a predetermined voltage is supplied to the driving device through the signal wire in, for example, a non-display period, the voltage adjusting unit serves to control at least one of the power source voltage of the power source unit and the voltage of the data signal at the signal wire driving unit, in such a manner that a quantity of driving current flowing through the current driving type monitoring light-emitting device, which is driven by current as in the case of the display light-emitting device, or a quantity of light emitted from the current driving type monitoring light-emitting device approaches a predetermined reference value( i.e., a reference current or a reference light quantity).

The monitoring light-emitting device which is provided in the monitoring region is driven by current as in the case of the display light-emitting device provided in the display region. It is therefore expected that the monitoring light-emitting device exhibits a tendency of deterioration over time similar to that exhibited by the display light-emitting device.

Hence, even if a driving current and a display light-emitting device are impeded as a result of deterioration over time of the display light-emitting device or the driving device which causes increase in a resistance of the display light-emitting device or the driving device, a quantity of driving current or a quantity of light emitted in the corresponding monitoring light-emitting device is maintained substantially constant. Thus, any decrease in a quantity of driving current or a quantity of emitted light, attributable to deterioration over time of the display light-emitting device or the driving device, can be appropriately compensated for by carrying out the voltage adjustment.

Further, even if there are variations in current-voltage characteristics or current-light emitting characteristics of the light-emitting device or the driving device among a plurality of pixels, the quantity of driving current or the quantity of emitted light in the light-emitting device of the corresponding plurality of pixels can be substantially equalized, if the voltage control by the voltage adjusting unit is effected on independent pixels. That is to say, variations of the driving current and emitted light quantity, attributable to the variations in the characteristics of the light-emitting device or the driving device, can effectively be corrected.

Thus, according to the second display apparatus, in a display apparatus in which the current driving type light-emitting device such as an organic EL device is driven by the driving device such as a thin film transistor, a decrease in screen luminance and screen irregularities at each pixel caused by deterioration over time can be reduced.

(7) In one form of the second display apparatus, the driving device comprises a thin film transistor having a gate to which the data signal is supplied, and a source and a drain between which the driving current flows, a conductance between the source and the drain being controlled by a gate voltage.

In this form of this display apparatus, when a data signal is supplied to the gate of the thin film transistor, the conductance between its source and drain is controlled (changed) by a gate voltage. Accordingly, the driving current flowing through the display light-emitting device via its drain and source can be controlled in accordance with the voltage of the data signal.

(8) In another form of the second display apparatus, the voltage adjusting unit comprises: a current measuring unit for measuring a quantity of current in the monitoring light-emitting device; and a voltage control unit for adjusting at least one of the voltages such that the measured current approaches a predetermined reference current value.

According to this form of the display apparatus, a current in the monitoring light-emitting device is measured by the current measuring unit. A voltage of the data signal or a power source voltage of the driving current is controlled by the voltage control unit such that the measured current approaches a predetermined reference current.

Accordingly, even if a driving current is impeded as a result of deterioration over time of the light-emitting device or the driving device which causes an increase in a resistance of the light-emitting device and the driving device, a quantity of driving current in the corresponding light-emitting device is maintained substantially constant. Further, even if there are variations in current-voltage characteristics in the light-emitting device or the driving device among a plurality of pixels, the quantity of driving current in the light-emitting device of the corresponding plurality of pixels can be substantially equalized, if the voltage control is performed on independent pixels.

(9) According to a further form of the second display apparatus, the voltage adjusting unit comprises: a light-emitting measuring unit for measuring a quantity of light emitted from the monitoring light-emitting device; and a voltage control unit for adjusting at least one of the voltages such that the measured quantity of emitted light approaches the reference quantity of emitted light.

According to this form, the quantity of light emitted from the monitoring light-emitting device is measured by the light measuring unit, and the voltage of the data signal or the power source voltage for the driving current is controlled by the voltage control unit, in such a manner that the measured light quantity approaches a predetermined reference light quantity.

Accordingly, even if a light-emitting device is impeded as a result of deterioration over time of the light-emitting device or the driving device which causes an increase in a resistance of the light-emitting device and the driving device, a quantity of light emitted in the corresponding light-emitting device is maintained substantially constant. Further, even if there are variations in current-voltage characteristics or current-light-emitting characteristics of the light-emitting device or the driving device among a plurality of pixels, the quantity of driving current in the light-emitting device of the corresponding plurality of pixels can be substantially equalized, if the voltage control of the data signal by the voltage adjusting unit is performed on independent pixels.

(10) A further form of the second display apparatus further comprises: a controller for controlling the voltage adjusting unit so as to adjust at least one of the voltages at a non-display period preceding a display period.

According to this form of this display apparatus, the voltage control unit controls the voltage of the data signal or the power source voltage for the driving current, under the control of a controller, in a non-display period preceding a display period. Therefore, the voltage control operation by the voltage adjusting unit can be performed without affecting the image display which is displayed in the display period.

(11) In a further form of the second display apparatus, the display light-emitting device and the monitoring light-emitting device are formed on a common substrate.

According to this form of this display apparatus, it is possible to expect similar tendency of deterioration over time both on the display light-emitting device and the monitoring light-emitting device, by operating these light-emitting devices under the same or similar conditions. This enables a highly accurate control of voltage adjustment on the display light emitting device, based on the current or light quantity on the monitoring light-emitting device.

(12) In a still further form of the second display apparatus, the display light-emitting device and the monitoring light-emitting device are formed in an identical step of process.

This form of the display apparatus offers an advantage in that the production process does not necessitate any additional step which otherwise may be required for forming the monitoring light-emitting device. Further, it is rather easy to form the display light-emitting device and the monitoring light-emitting device with the same or similar characteristics and, hence, with the same or similar tendencies of deterioration over time.

(13) In a yet further form of the second display apparatus, the power source voltage unit provides a power source which supplies the driving current during a display period both to the display light-emitting device and the monitoring light-emitting device.

With this form, the display light-emitting device and the monitoring light-emitting device exhibit similar or the same tendencies of deterioration over time, since both these light-emitting devices are supplied with driving current during the display periods.

(14) To solve the technical problems described above, the present invention provides a pixel circuit provided for each of a plurality of matrix pixels constituting a display region of a display apparatus having, at least, a signal wire to be supplied with a data signal and first and second feeder lines for supplying power source voltage to flow a driving current, the pixel circuit comprising: a current driving type light-emitting device connected between the first and second feeder lines; a first thin film transistor (current-controlling thin film transistor) controlling the driving current flowing through the light-emitting device via a source and a drain connected between the first and second feeder lines in series to said light-emitting device in accordance with a voltage of said data signal supplied to a gate; and a driving current compensation device for increasing the driving current according to at least one of a decrease in a quantity of driving current and a decrease in a quantity of light emitted from the light-emitting device.

According to the pixel circuit of the present invention, supplying power source via first and second feeder lines causes a driving current to flow to the light-emitting device via the source and the drain of the first thin film transistor. Meanwhile, a data signal is supplied to a gate of the first thin film transistor via the signal wire. In the meantime, a conductance between the source and the drain of the first thin film transistor is controlled (changed) by a gate voltage, so that the driving current flowing to the light-emitting device is controlled according to the voltage of the data signal. As a result, the current driving type light-emitting device illuminates in accordance with the voltage of the data signal. Additionally, the driving current flowing as described above is increased by the driving current compensation device in accordance with a decrease in quantity of driving current or quantity of light emitted.

Hence, even if the driving current or the light-emitting device is impeded as a result of deterioration over time of the light-emitting device or the first thin film transistor which causes an increase in a resistance of the light-emitting device or the first thin film transistor, a quantity of driving current or a quantity of emitted light in the light-emitting device is maintained substantially constant.

That is, any decrease in the quantity of driving current or the quantity of emitted light caused by deterioration over time of the light-emitting device or the first thin film transistor can automatically be corrected by an operation to increase the driving current through, for example, a reduction in a resistance effected by the driving current compensation device.

Further, since the correction described above is made separately for each of a plurality of pixels, even if there are variations in current-voltage characteristics and current-light-emitting characteristics of the light-emitting device or the first thin film transistor among a plurality of pixels, a quantity of driving current or a quantity of emitted light in the corresponding light-emitting device can be maintained substantially constant. That is, any variation in the quantity of driving current or the quantity of emitted light caused by variation of characteristics of the light-emitting device or the first thin film transistor can be automatically corrected.

As a result, according to the pixel circuit of the present invention, in a pixel circuit in which a current driving type light-emitting device such as an organic EL device is driven by a first thin film transistor, a decrease in screen luminance or screen irregularities caused by deterioration over time or variations in characteristics in each device can be reduced.

(15) In one embodiment of the pixel circuit, the signal wire includes a signal line to be supplied with the data signal and a scanning line to be supplied with a scanning signal. In addition, the pixel circuit further comprises a second thin film transistor (switching thin film transistor) connected in such a manner that the data signal is supplied to a gate of the first thin film transistor via a drain and a source when the scanning signal is supplied to a gate. According to this embodiment, supplying a scanning signal to the gate of the second thin film transistor via a scanning line causes the source and drain of the second thin film transistor to be brought into conduction. In parallel therewith, supplying a data signal to the source or the drain of the second thin film transistor via the signal line causes the data signal to be supplied to the gate of the first thin film transistor via the source and the drain of the second thin film transistor.

(16) In another embodiment of the pixel circuit, the driving current compensation device controls a resistance between the first feeder line and the second feeder line depending upon a relation between a voltage across the light-emitting device and a quantity of the driving current.

According to this embodiment, by adjusting a resistance between the first feeder line and the second feeder line by the driving current compensation device depending upon a relationship between a voltage across the light-emitting device and a quantity of driving current, the driving current is increased to compensate for a reduction of the same driving current.

(17) In the pixel circuit in which the control is performed depending upon the relationship between a voltage and a current, the arrangement may be such that an electric potential of the first feeder line is set to be higher than that of the second feeder line, and the driving current compensation device includes a first correction thin film transistor of an n-channel type having a gate connected to an electrode on the first feeder line side of the light-emitting device and a source and a drain connected between the light-emitting device and the second feeder line in series to the light-emitting device.

In this case, a resistance between the first feeder line and the second feeder line is adjusted by the first correction thin film transistor of an n-channel type, so that the driving current is increased to compensate for a reduction of the same driving current.

(18) Alternatively, in the pixel circuit in which the control is performed depending upon the relationship between a voltage and a current, the arrangement may be such that an electric potential of the first feeder line is set to be lower than that of the second feeder line, and the driving current compensation device includes a first correction thin film transistor of a p-channel type having a gate connected to an electrode on the first feeder line side of the light-emitting device and a source and a drain connected between the light-emitting device and the second feeder line in series to the light-emitting device.

In this case, a resistance between the first feeder line and the second feeder line is adjusted by the first correction thin film transistor of a p-channel type, so that the driving current is increased to compensate for a reduction of the same driving current.

(19) Alternatively, in the pixel circuit in which the control is performed depending upon the relationship between a voltage and a current, the arrangement may be such that an electric potential of the first feeder line is set to be higher than that of the second feeder line, and the driving current compensation device includes a second correction thin film transistor of a p-channel type having a gate connected to an electrode on the second feeder line side of the light-emitting device and a source and a drain connected between the light-emitting device and the second feeder line in series to the light-emitting device.

In this case, a resistance between the first feeder line and the second feeder line is adjusted by the second correction thin film transistor of a p-channel type, so that the driving current is increased to compensate for a reduction of the same driving current.

(20) Alternatively, in the pixel circuit in which the control is performed depending upon the relationship between a voltage and a current, the arrangement may be such that an electric potential of the first feeder line is set to be lower than that of the second feeder line, and the driving current compensation device includes a second correction thin film transistor of an n-channel type having a gate connected to an electrode on the second feeder line side of the light-emitting device and a source and a drain connected between the light-emitting device and the first feeder line in series to the light-emitting device.

In this case, a resistance between the first feeder line and the second feeder line is adjusted by the second correction thin film transistor of an n-channel type, so that the driving current is increased to compensate for a reduction of the same driving current.

(21) In a different embodiment of the pixel circuit, a retention capacitor is further provided which is connected to a gate of said first thin film transistor, for retaining a gate voltage of the first thin film transistor.

According to this embodiment, the gate voltage of the first thin film transistor, after being supplied with a data signal, is retained by the retention capacitor. Accordingly, the driving current via the source and the drain of the first thin film transistor can flow for longer time than the period of supplying of the data signal.

(22) In the embodiment in which the retention capacitor is further provided, the arrangement may be such that the driving current compensation device controls a resistance between either of said first or second feeder lines and the retention capacitor, depending on a relationship between a voltage across the light-emitting device and the driving current.

According to the embodiment, a resistance between the first or the second feeder and the retention capacitor is controlled by the driving current compensation device depending upon a relationship between a voltage across the light-emitting device and a quantity of a driving current, thereby increasing the driving current to compensate for a reduction of the same driving current.

(23) In the embodiment employing the control of a resistance between a feeder line and the retention capacitor, the arrangement may be such that an electric potential of the first feeder line is set to be higher than that of the second feeder line, and the driving current compensation device includes a third correction thin film transistor of the same channel type n or p as the first thin film transistor, having a gate connected to an electrode on the first feeder line side of the light-emitting device and a source and a drain connected between the retention capacitor and the first feeder line.

With this arrangement, a resistance between the first or second feeder line and the retention capacitor is controlled by the third correction thin film transistor of the same channel type n or p as the first thin film transistor, so that the driving current flowing from the first feeder line to the second feeder line is increased to compensate for the decrease of the same driving current.

(24) Alternatively, in the embodiment employing the control of a resistance between a feeder line and the retention capacitor, the arrangement may be such that an electric potential of the first feeder line is set to be lower than that of the second feeder line, and the driving current compensation device includes a third correction thin film transistor of the same channel type n or p as the first thin film transistor, having a gate connected to an electrode on the first feeder line side of the light-emitting device and a source and a drain connected between the retention capacitor and the first feeder line.

With this arrangement, a resistance between the first or second feeder line and the retention capacitor is controlled by the third correction thin film transistor of the same channel type n or p as the first thin film transistor, so that the driving current flowing from the second feeder line to the third feeder line is increased to compensate for the decrease of the same driving current.

(25) Alternatively, in the embodiment employing the control of a resistance between a feeder line and the retention capacitor, the arrangement may be such that an electric potential of the first feeder line is set to be higher than that of the second feeder line, and the driving current compensation device includes a fourth correction thin film transistor of the opposite channel type n or p to that of the first thin film transistor, having a gate connected to an electrode on the first feeder line side of the light-emitting device and a source and a drain connected between the retention capacitor and the second feeder line.

With this arrangement, a resistance between the first or second feeder line and the retention capacitor is controlled by the fourth correction thin film transistor of the opposite channel type n or p to the first thin film transistor, so that the driving current flowing from the first feeder line to the second feeder line is increased to compensate for the decrease of the same driving current.

(26) Alternatively, in the embodiment employing the control of a resistance between a feeder line and the retention capacitor, the arrangement may be such that an electric potential of the first feeder line is set to be lower than that of the second feeder line, and the driving current compensation device includes a fourth correction thin film transistor of the opposite channel type n or p to that of the first thin film transistor, having a gate connected to an electrode on the first feeder line side of the light-emitting device and a source and a drain connected between the retention capacitor and the second feeder line.

With this arrangement, a resistance between the first or second feeder line and the retention capacitor is controlled by the fourth correction thin film transistor of the opposite channel type n or p to the first thin film transistor, so that the driving current flowing from the second feeder line to the first feeder line is increased to compensate for the decrease of the same driving current.

(27) In a different embodiment of the pixel circuit, the driving current compensation device controls a resistance between the first feeder and the second feeder, depending upon a relationship between a voltage across the light-emitting device and a quantity of the emitted light.

In this embodiment, a resistance between the first feeder and the second feeder is controlled by the driving current compensation device depending on a relationship between a voltage across the light emitting device and a quantity of the light emitted, whereby the driving current is increased in accordance with a decrease in a quantity of the light-emitting device.

(28) In the embodiment having the retention capacitor, the arrangement may be such that the driving current compensation device controls a resistance between either of the first or second feeder lines and the retention capacitor, depending on a relationship between a voltage across the light-emitting device and a quantity of the emitted light.

With this arrangement, a resistance between the first or second feeder line and the retention capacitor is controlled by the driving current compensation device, whereby the driving current is increased in accordance with a decrease in a quantity of the emitted light.

(29) In the embodiment in which a resistance between the feeder line and the retention capacitor is controlled depending upon a relationship between a voltage and a quantity of emitted light, the arrangement may be such that an electric potential of the first feeder line is set to be higher than that of the second feeder line, and the first thin film transistor is of a p channel type, while the driving current compensation device includes a first correction thin film photo-diode connected between the retention capacitor and the first feeder line.

With this arrangement, a resistance between the first or second feeder line and the retention capacitor is controlled by the first correction thin film photo-diode, whereby a driving current flowing from the first feeder line to the second feeder line through the p-channel type first thin film transistor is increased in accordance with a decrease in a quantity of the emitted light.

(30) In the embodiment in which a resistance between the feeder line and the retention capacitor is controlled depending on a relationship between a voltage and a quantity of emitted light, the arrangement may be such that an electric potential of the first feeder line is set to be higher than that of the second feeder line, and the first thin film transistor is of a p channel type, and the driving current compensation device includes a fifth correction thin film transistor having a source and a drain connected between the retention capacitor and the first feeder line.

With this arrangement, a resistance between the first or second feeder line and the retention capacitor is controlled by the fifth correction thin film transistor, whereby a driving current flowing from the first feeder line to the second feeder line through the p-channel type first thin film transistor is increased in accordance with a decrease in a quantity of the emitted light.

(31) Alternatively, the embodiment in which a resistance between the feeder line and the retention capacitor is controlled depending on a relationship between a voltage and a quantity of light emitted, the arrangement may be such that an electric potential of the first feeder line is set to be lower than that of the second feeder line, and the first thin film transistor is of an n channel type, and the driving current compensation device includes a first correction thin film photo-diode connected between the retention capacitor and the first feeder line.

With this arrangement, a resistance between the first or second feeder line and the retention capacitor is controlled by the first correction thin film photo-diode, whereby a driving current flowing from the second feeder line to the first feeder line through the n-channel type first thin film transistor is increased in accordance with a decrease in a quantity of the emitted light.

(32) Alternatively, in the embodiment in which a resistance between the retention capacitor and the feeder line is controlled depending on a relationship between a voltage and a quantity of light emitted, the arrangement may be such that an electric potential of the first feeder line is set to be lower than that of the second feeder line, and the first thin film transistor is of an n channel type, and the driving current compensation device includes a fifth correction thin film transistor having a source and a drain connected between the retention capacitor and the first feeder line.

With this arrangement, a resistance between the first or second feeder line and the retention capacitor is controlled by the fifth correction thin film transistor, whereby a driving current flowing from the second feeder line to the first feeder line through the n-channel type first thin film transistor is increased in accordance with a decrease in a quantity of the emitted light.

(33) Alternatively, in the embodiment in which a resistance between the feeder line and the retention capacitor is controlled depending on a relationship between a voltage and a quantity of light emitted, the arrangement may be such that an electric potential of the first feeder line is set to be higher than that of the second feeder line, and the first thin film transistor is of an n channel type, and the driving current compensation device includes a second correction thin film photo-diode connected between the retention capacitor and the second feeder line.

With this arrangement, a resistance between the first or second feeder line and the retention capacitor is controlled by the second correction thin film photo-diode, whereby a driving current flowing from the first feeder line to the second feeder line through the n-channel type first thin film transistor is increased in accordance with a decrease in a quantity of the emitted light.

(34) Alternatively, in the embodiment in which a resistance between the feeder line and the retention capacitor is controlled depending on a relationship between a voltage and a quantity of light emitted, the arrangement may be such that an electric potential of the first feeder line is set to be higher than that of the second feeder line, and the first thin film transistor is of an n channel type, and the driving current compensation device includes a sixth correction thin film transistor having a source and a drain connected between the retention capacitor and the second feeder line.

With this arrangement, a resistance between the first or second feeder line and the retention capacitor is controlled by the sixth correction thin film transistor, whereby a driving current flowing from the first feeder line to the second feeder line through the n-channel type first thin film transistor is increased in accordance with a decrease in a quantity of the emitted light.

(35) Alternatively, in the embodiment in which a resistance between the feeder line and the retention capacitor is controlled depending on a relationship between a voltage and a quantity of light emitted, the arrangement may be such that an electric potential of the first feeder line is set to be lower than that of the second feeder line, and the first thin film transistor is of a p channel type, and the driving current compensation device includes a second correction thin film photo-diode connected between the retention capacitor and the second feeder line.

With this arrangement, a resistance between the first or second feeder line and the retention capacitor is controlled by the second correction thin film photo-diode, whereby a driving current flowing from the second feeder line to the first feeder line through the p-channel type first thin film transistor is increased in accordance with a decrease in a quantity of the emitted light.

(36) Alternatively, in the embodiment in which a resistance between the feeder line and the retention capacitor is controlled depending on a relationship between a voltage and a quantity of light emitted, the arrangement may be such that an electric potential of the first feeder line is set to be lower than that of the second feeder line, and the first thin film transistor is of a p channel type, and the driving current compensation device includes a sixth correction thin film transistor having a source and a drain connected between the retention capacitor and the second feeder line.

With this arrangement, a resistance between the first or second feeder line and the retention capacitor is controlled by the sixth correction thin film transistor, whereby a driving current flowing from the second feeder line to the first feeder line through the p-channel type first thin film transistor is increased in accordance with a decrease in a quantity of the emitted light.

(37) In a different embodiment of the pixel circuit, the driving current compensation device includes a thin film transistor which is formed in the same step of a process as the first thin film transistor.

This offers an advantage in that the production process does not necessitate any additional step for forming the current driving compensation device.

(38) In order to achieve the objects described before, a third display apparatus in accordance with the present invention comprises: a current driving type light-emitting device provided for each pixel; a driving device provided for each the pixel, for controlling a driving current flowing to the light-emitting device in accordance with a voltage of a data signal; a power source unit for supplying power source voltage through a power wire to cause the driving current to flow to the light-emitting device via the driving device; a signal line driving circuit for supplying, through a signal line, a data signal having a voltage corresponding to an image signal input from an image signal source to the driving device; a measuring unit for measuring at least one of a quantity of driving current flowing through the light-emitting device and a quantity of light emitted from the light-emitting device at the time when a data signal of a predetermined voltage is supplied to the driving device via the signal line; and a correction circuit provided between the image signal source and the signal line driving circuit, for inputting the image signal to the signal line driving circuit after correcting the image signal in such a manner that at least one of the measured quantity of driving current and the measured quantity of emitted light comes close to a predetermined reference value.

In the third display apparatus as defined above, a driving current flows to the light-emitting device via the driving device, as the power source voltage is supplied from the power source unit, while a data signal, which is received from the image signal source and which has a voltage corresponding to the image signal, is supplied to the driving device from the signal line driving circuit through the signal line. A driving current flowing to the light-emitting device is controlled by the driving device in accordance with a voltage of the data signal. As a consequence, the current driving type light-emitting device emits light by the driving current, in accordance with a voltage of the data signal. When a data signal of a predetermined voltage is supplied to the driving device through a signal line in, for example, a non-display period, the measuring unit measures a quantity of driving current flowing through the light emitting device or a quantity of light emitted from the same. Then, the correction circuit corrects the image signal in such a manner that the driving current or the light quantity as measured approaches a predetermined reference value( i.e., a reference voltage or a reference quantity). The corrected image signal is input to the signal line driving circuit. Consequently, the driving device is supplied with the data signal of a voltage corresponding to the corrected image signal, from the signal line driving circuit via a signal line.

Hence, even if a driving current or a light-emitting device is impeded as a result of deterioration over time of the light-emitting device or the driving device which causes an increase in a resistance of the light-emitting device or the driving device, a quantity of driving current or a quantity of light emitted in the corresponding light-emitting device is maintained substantially constant. Further, even if there are variations in current-voltage characteristics or current-light emitting characteristics of the light-emitting device or the driving device among a plurality of pixels, the quantity of driving current or the quantity of emitted light in the light-emitting device of the corresponding plurality of pixels can be substantially equalized, if the voltage control by the voltage adjusting unit is performed on independent pixels.

Thus, according to the third display apparatus, in a display apparatus in which the current driving type light-emitting device such as an organic EL device is driven by the driving device such as a thin film transistor, a decrease in screen luminance and screen irregularities caused by deterioration or variations in the characteristics can be reduced.

(39) In one form of the third display apparatus in accordance with the present invention, the driving device comprises a thin film transistor having a gate to be supplied with the data signal, and a source and a drain between which the driving current flows, a conductance between the source and the drain being controlled in accordance with the gate voltage.

With this arrangement, a conductance between the source and the drain of the thin film transistor is controlled in accordance with a voltage of the data signal supplied to the gate. It is therefore possible to control the driving current flowing through the light emitting device via the drain and the source can be controlled in accordance with the voltage of the data signal.

(40) Another form of the third display apparatus of the invention further comprises a memory device for storing at least one of the measured quantity of driving current and the measured quantity of emitted light, and the correction circuit corrects the image signal in accordance with at least one of the stored quantity of driving current and the stored quantity of emitted light.

With this arrangement, the current or light quantity as measured is stored in the memory device. The image signal is corrected by the correction circuit in accordance with the stored current or light quantity. It is therefore possible to perform the correction during the display period, based on the results of measurement conducted in a non-display period which precedes or follows the display period in point of time. It is also possible to perform correction on a plurality of pixels, using a common measuring unit and a correction circuit.

(41) In a further form of the third display apparatus of the present invention, the power source wire is provided for each pixel column, and the measuring unit measures a quantity of the driving current, the display apparatus further comprising a common line driving circuit which includes: a changeover switch for switching the power source wire to the power source unit side at a display period, and to the measuring unit side at a non-display period; a shift register for sequentially outputting sequential pulses in accordance with each power source wire; and a transmission switch for sequentially controlling conduction between each power source wire and the measuring unit in response to the sequential pulses at the non-display period.

According to this arrangement, during the display period, the change-over switch in the common line driving circuit connects the power source wire to the power source unit side, so that the light-emitting device is supplied with power source voltage from the power source unit to illuminate, thus performing ordinary displaying operation. On the other hand, in a non-display period, the power source wire is connected to the measuring unit side by the change-over switch. In the meantime, the shift register sequentially outputs sequential pulses, and the transmission switch operates in accordance with the sequential pulses so as to have conductance between each power source wire and the measuring unit, so that the measuring unit measures a quantity of driving current. Thus, the power source wires corresponding to the respective pixel columns are sequentially selected as the measuring object, whereby the driving currents for the successive columns of pixels are measured. Furthermore, measurement of the driving current can be conducted for each of the pixels, provided that a scanning signal is used to enable driving the light-emitting device on each pixel-line basis. It is therefore possible to perform correction on pixel-column basis or pixel basis.

(42) In a different form of the third display apparatus of the invention, the measuring unit measures a quantity of emitted light. This display apparatus further comprises: a light detecting line, provided for each the pixel column, for transmitting an electrical signal indicative of the quantity of emitted light to the measuring unit; and a light detecting line driving circuit which includes a shift register for sequentially outputting sequential pulses in accordance with each the light detecting lines, and a transmission switch for sequentially controlling conduction between each the light detecting line and the measuring unit in response to the sequential pulses at a non-display period.

In accordance with this arrangement, during a non-display period, the shift register sequentially outputs sequential pulses in accordance with the respective light detecting lines, and the transmission switch operates in response to the sequential pulses so as to have conductance between the successive light detecting lines and the measuring unit, so that the measuring unit measures a quantity of light emitted. Thus, the light detecting lines corresponding to the respective pixel columns are sequentially selected as the measuring object, whereby the quantities of emitted light are measured on pixel-column basis. Furthermore, measurement of the light quantity can be conducted for each of the pixels, provided that a scanning signal is used to enable driving the light-emitting device on pixel-line basis. It is therefore possible to perform correction on pixel-column basis or pixel basis.

(43) In a different form of the third display apparatus, the measuring unit measures the quantity of emitted light through measurement of a photo-excited current of a semiconductor device.

In accordance with this arrangement, a quantity of light emitted from the light-emitting device is measured by the measuring unit through measurement of the photo-excited current of the semiconductor element, and a correction is performed on the basis of the measured light quantity. It is therefore possible to perform measurement with a high degree of accuracy by using a comparatively simple device.

(44) When a quantity of light emitted is measured through measurement of photo-excitation current of the semiconductor device, the semiconductor device may be a PIN diode.

In this case, a quantity of light emitted from the light-emitting device can be measured by measuring the photo-excitation current at the PIN junction of the PIN diode.

(45) Alternatively, the semiconductor device may comprise a field effect transistor.

In this case, a quantity of light emitted from the light-emitting device can be measured by measuring the photo-excitation current at the channel of the field effect transistor.

(46) In a further alternative, the driving device comprises a thin film transistor which is formed in the same step of a process as the semiconductor device.

In this case, the driving device and the semiconductor element can be formed in the same step of a production process, which is advantageous from the production point of view.

(47) In a different form of the third display apparatus in accordance with the invention, the driving device comprises a polycrystalline thin film transistor formed through a low-temperature process of 600° C. or less.

This feature makes it possible to form a driving device having high driving performance on a comparatively inexpensive large-size glass substrate or the like, thus contributing to a reduction in the production cost.

(48) In a different form of the third display apparatus, the light-emitting device comprises an organic electroluminescent device formed through an ink-jet process.

This feature enables production of a light-emitting device having high illuminating efficiency and capable of standing a long use, contributing to easy patterning on the substrate. Further, the production process can be implemented by using a comparatively inexpensive apparatus, while reducing the amount of material to be wasted from the process, contributing to a cost reduction in the display apparatus.

(49) In a different form of the third display apparatus, the measuring unit measures at least one of the driving current and the quantity of emitted light for each pixel, and the correcting circuit corrects the image signal for each pixel.

In accordance with this arrangement, the measurement of the driving current or the quantity of emitted light is performed by the measuring unit on a pixel basis, and the correction of the image signal by the correction circuit also is conducted on a pixel basis. It is therefore possible to substantially equalize a quantity of driving current or a quantity of emitted light of the light-emitting device in the corresponding plurality of pixels, despite any variation among the pixels in regard to voltage-current characteristics and current-light-emitting characteristics of the light-emitting device and the driving device, attributable to variations incurred during the production and variations of degree of deterioration. It is thus possible to reduce any screen irregularities, attributable to variations in the characteristics of each device.

(50) In a different form of the third display apparatus, the measuring unit measures at least one of the driving current and the quantity of emitted light for each predetermined block having a number of pixels, and the correcting circuit corrects the image signal for the each predetermined block.

According to this arrangement, the measurement of the driving current or the emitted light quantity is performed by the measuring unit on a predetermined pixel-block basis, each block having a number of pixels. In addition, the correction of the image signal is performed by the correction circuit on the predetermined pixel-block basis. For instance, one pixel block includes n pieces of adjacent pixels (n being 2, 4, 8, 16. 32. 64 or so). The number of pixels contained in the pixel block may be determined based on factors such as the required level of uniformity of luminance, processing performance of the measuring unit and the correction circuit, and so forth. It is therefore possible to substantially equalize a quantity of driving current and a quantity of emitted light among a plurality of pixel blocks, despite any variation among the pixel blocks in regard to voltage-current characteristics and current-light-emitting characteristics of the light-emitting device and the driving device, attributable to variations incurred during the production and variations of degree of deterioration. It is thus possible to reduce any screen irregularities, attributable to variations in the characteristics of each device. In this case, the measurement and correction can be performed more easily in shorter time, as compared with the case where the measurement and the correction are performed on a pixel basis.

(51) In a different form of the third display apparatus, the correcting circuit corrects the image signal by converting a signal level of the image signal from a specified signal level to another specified signal level.

In accordance with this form of the display apparatus, the correction of the image signal by the correction circuit is performed such that the signal level of the image signal is converted from a specified signal level to another specified signal level. This eliminates the necessity of provision of signal levels different from the specified signal levels, thus offering advantages such as simplification of the signal line driving circuit or reduction in the number of power sources required for the signal line driving circuit. Consequently, the display apparatus can operate at high speed with reduced electrical current, using a simplified circuitry.

(52) In order to achieve the above-described object, a fourth display apparatus of the present invention incorporates any of the foregoing pixel circuits, for each of the pixels.

In the fourth display apparatus as defined above, since each pixel is driven and controlled by its own pixel circuit of the present invention, it is possible to reduce screen irregularities and reduction in the display luminance which are attributable to deterioration over time and variations in characteristics of the light-emitting device and the driving device, thus achieving a high quality of image display.

(53) In order to achieve the object of the invention described before, an electronic apparatus of the present invention incorporates any form of any one of the first to third display apparatuses of the invention.

By virtue of the use of the display apparatuses of the invention, reduction in the display luminance and screen irregularities attributable to deterioration over time and variations in characteristics of the light-emitting device and the driving device, can be suppressed. It is thus possible to obtain a variety of types of electronic apparatuses capable of providing high quality of image display.

BEST MODE FOR CARRYING OUT THE INVENTION

A best mode for carrying out the present invention will be explained with respect to each embodiment with reference to the accompanying drawings.

Figure 1:
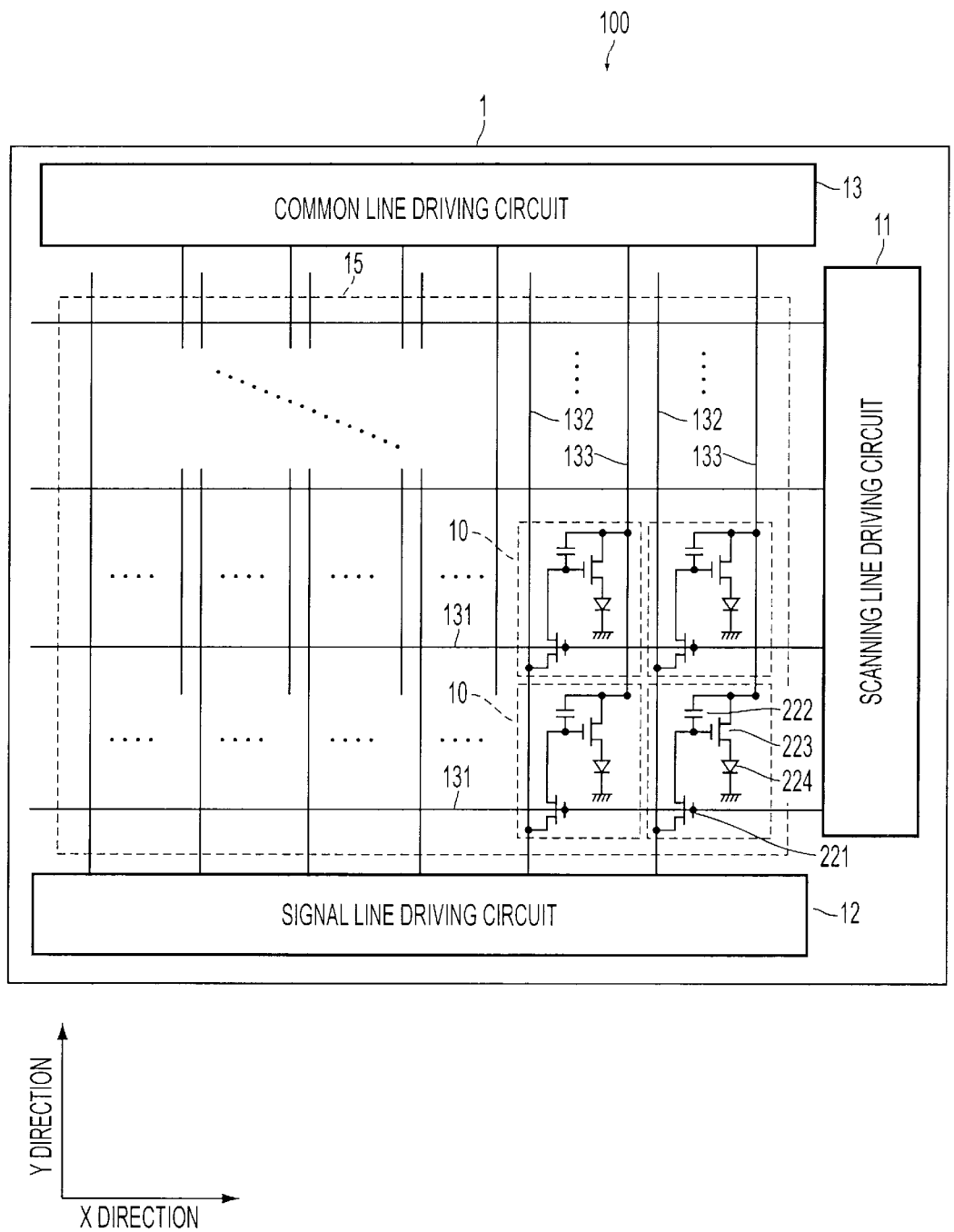
FIG. 1 is a block diagram of a fundamental entire arrangement structure of a display apparatus commonly used for each embodiment according to the present invention.

First, a common basic arrangement in a display apparatus provided with a TFT-OELD (that is, a current drive type thin film transistor for use in driving an organic EL device) will be explained with reference to FIGS. 1 and 2. FIG. 1 is a block diagram showing a basic entire arrangement of a display apparatus, especially including a basic schematic circuit diagram of a pixel circuit respectively provided for each of four pixels positioned adjacently to one another. Additionally, FIG. 2 is a plan view of a pixel of this display apparatus.

As shown in FIG. 1, a display apparatus 100 is composed of a plurality of scanning lines 131 each extending in the X direction and arranged in the Y direction on a TFT array substrate 1, a plurality of signal lines 132 each extending in the Y direction and arranged in the X direction, and a plurality of common lines (common feeder lines) 133 each extending in the Y direction and arranged in the X direction. The display apparatus 100 is further composed of a scanning line driving circuit 11 for supplying a scanning signal to the scanning line 131, a signal line driving circuit 12 for supplying a data signal to the signal line 132, and a common line driving circuit 13 for supplying a positive potential (or a negative potential) of a predetermined voltage to the common line 133. In addition, a display region 15 is provided in the center of the TFT array substrate 1, and a plurality of pixels 10 are arranged in a matrix-like configuration within the display region 15.

Figure 2:
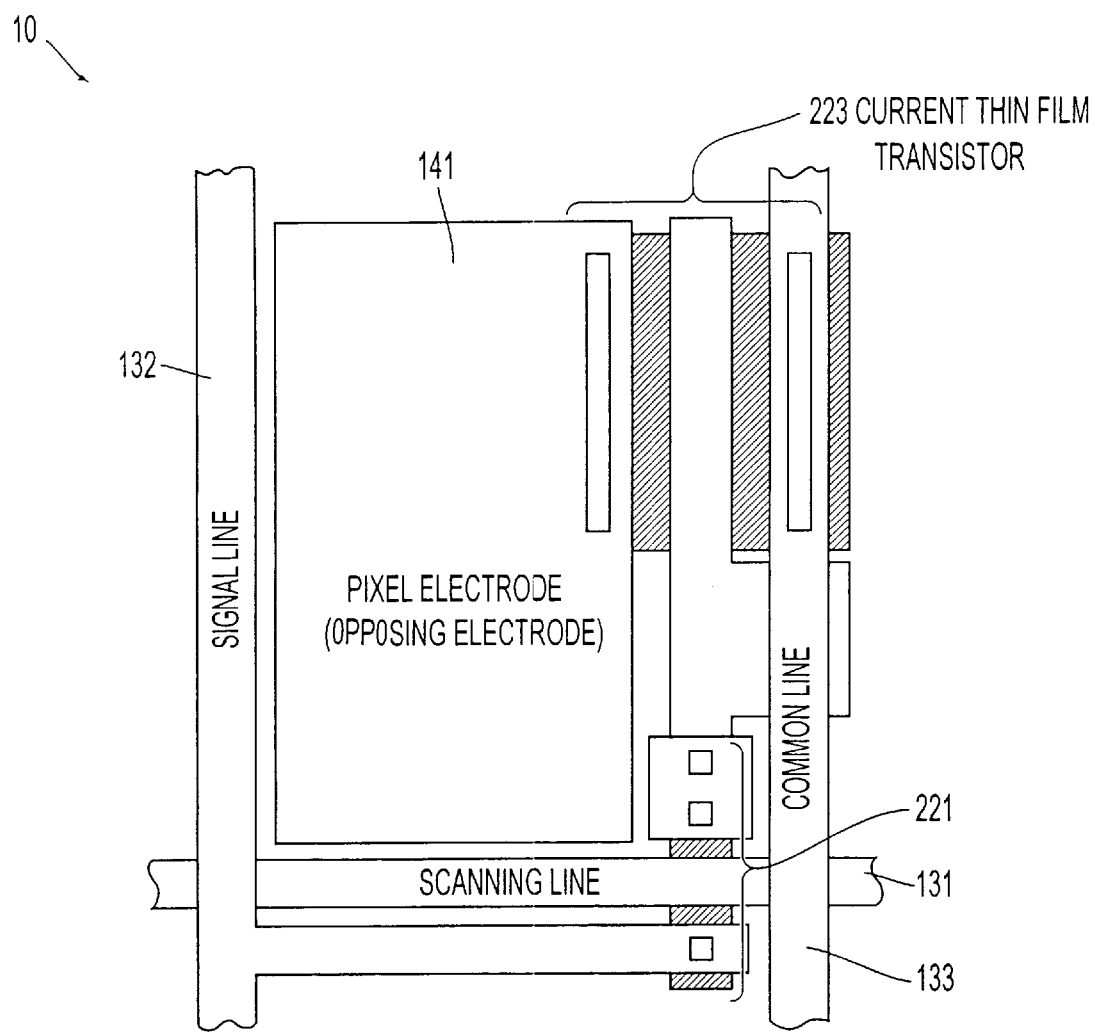
FIG. 2 is a plan view of a pixel in a display apparatus shown in FIG. 1.

As shown in FIGS. 1 and 2, each pixel 10 is provided with a pixel circuit composed of a switching TFT 221 as an example of the second thin film transistor, a TFT 223 (hereinafter, called a current "TFT".) as an example of the first thin film transistor controlled by the switching TFT 221 to control a current to each pixel, an organic EL device transistor 224, and a retention capacitor 222. Further, a pixel electrode 141 composed of ITO (Indium Tin Oxide) film, etc. is connected to a drain of the current TET 223 (refer to FIG. 2), and an opposing electrode composed of Al (Aluminum) film and so forth is arranged opposite to the pixel electrode 141 via the organic EL device 224. The opposing electrode is, for example, grounded or connected to a negative power source (or a positive power source) of a predetermined electric potential.

As is configured as described above, luminescence movement at a pixel is carried out as follows. That is, when a scanning signal is output from the scanning line driving circuit 11 to the scanning line 131, and in addition, a data signal is supplied to the signal line 132 from the signal driving circuit 12, the switching TET 221 in the pixel 10 corresponding to these scanning line 131 and the signal line 132 that is turned on, and then voltage from the data signal supplied to the signal line 132 ($V_{sig}$) is applied to the gate of the current TFT 223. Whereby, a driving current (Id) corresponding to the gate voltage flows between the drain and the source of the current TFT 223 via the common line 133 from the common line driving circuit 13, and in addition, the current flows from the organic EL device 224 to the opposing electrode via the pixel electrode 141 (refer to FIG. 2), thereby causing the organic EL device 224 to emit light. Then, electric charge stored in the retention capacitor 222 while the switching TFT 221 is on is discharged after the switching TFT 221 is turned off. The current flowing through the organic EL device 224 continues to flow for a predetermined period of time even after the switching TFT 221 is turned off.

Although a current driving type light-emitting device driven by a current at each pixel of the display apparatus is defined as an organic EL device in each embodiment to be described hereinbelow, instead of the organic EL device, other well-known current driving light-emitting devices such as, for example, an inorganic electroluminescence (hereinafter, called "an inorganic EL device"), an LED (Light Emitting Diode), and an LEP (Light Emitting Polymer) may be used in the corresponding display apparatus. Additionally, although a driving device for controlling the driving current of each current driving type light-emitting device is defined to be the current TFT, in place of the current TFT, other driving devices such as, for example, a FET (Field Effect Transistor), and a bipolar transistor may be used in the corresponding display apparatus. As long as the current driving type light-emitting device or the current driving type driving device is used, since deterioration over time occurs even to a small degree as the driving current flows, effects on each embodiment to be described hereinafter is displayed. Note that, when the display apparatus is configured by using the organic EL device 224 and the current TFT 223 having extreme deterioration over time, each of the effects of the embodiments to be explained hereinbelow is significantly displayed.

In the basic arrangement described above, the addition of a circuit or a device adequately correcting deterioration over time or variations in characteristics in the organic EL device 224 or the current TFT 223 shown in the first embodiment through to the third embodiment enables screen luminance or screen irregularities among a plurality of pixels 10 in the display region 15 to be prevented from occurring. Hereinbelow, each embodiment will be described.

(First Embodiment)

Figure 3:
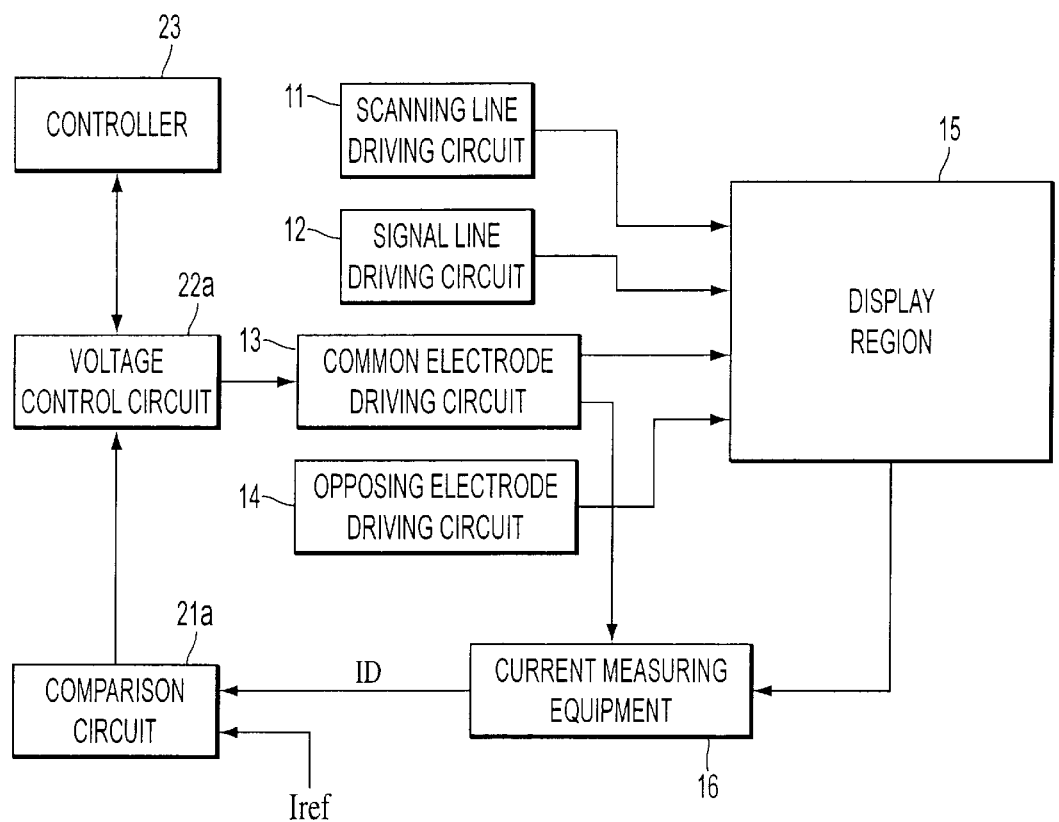
FIG. 3 is a block diagram of a display apparatus of the first embodiment according to the present invention.

FIG. 3 is a block diagram of a display apparatus provided with a TET-OELD according to a first embodiment of the present invention. In the present embodiment, the common electrode driving circuit 13 supplies a power source signal of a predetermined potential (for example, a positive potential) to the common line 133 (refer to FIGS. 1 and 2). The opposing electrode driving circuit 14 supplies a power source signal of a predetermined voltage (for example, a ground potential) to an opposing electrode arranged opposite to the pixel electrode 141 (refer to FIG. 2) with the organic EL device 224 sandwiched therebetween.

In the present embodiment, to especially correct a decrease in the driving current resulting from deterioration over time of the organic EL device 224 or the current TFT 223 (accordingly a decrease in a quantity of emitted light of the organic EL device 224), a current measuring equipment 16, a comparison circuit 21a, a voltage control circuit 22a, and a controller 23 are provided. At least one of these common electrode driving circuit 13, the opposing electrode driving circuit 14, the current measuring equipment 16, the comparison circuit 21a, the voltage control circuit 22a or the controller 23 may be provided on the TFT array substrate 1. Otherwise, it may be configured as an external IC and externally mounted on the TFT array substrate 1.

The current measuring equipment 16 measures a driving current which flows from the common electrode driving circuit 13 to a display organic EL device 224 (refer to FIG. 1) provided for in the display region 15.

The comparison circuit 21a compares the measured current ID measured by the current measuring equipment 16 to a predetermined reference current $I_{ref}$. The voltage control circuit 22a adjusts the output voltage ($V_{oom}$) of the common electrode driving circuit 13 based upon the comparison results in such a manner that the difference between both of the currents decreases. That is, feedback is given to the output voltage $V_{oom}$ from the common electrode driving circuit 13 in such a manner that the measured current ID comes close to the reference current $I_{ref}$. As a result, the decrease, as a result of deterioration over time in the organic EL device 224 or the current TFT 223, in the driving current flowing through the organic EL device 224 which is obtained in the case without feedback is corrected with an increase in the driving current resulting from the increase in the output voltage ($V_{oom}$) of the common electrode driving circuit 13.

Figure 4:
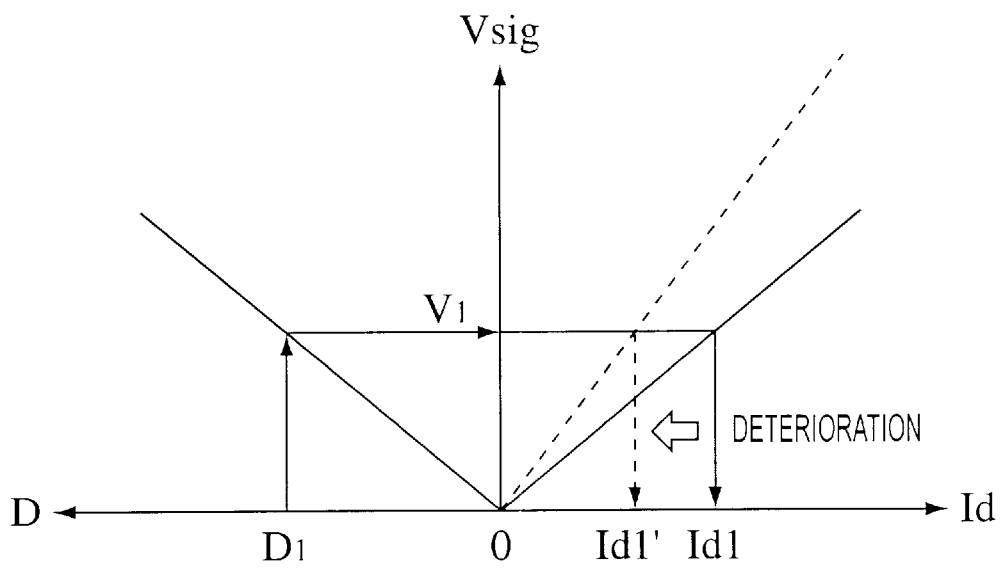
FIG. 4 is a characteristic diagram showing relation between gradation level (D), a data signal voltage ($V_{sig}$) and a driving current (Id), and a way of correcting deterioration of an image signal for the first embodiment.
Figure 4:
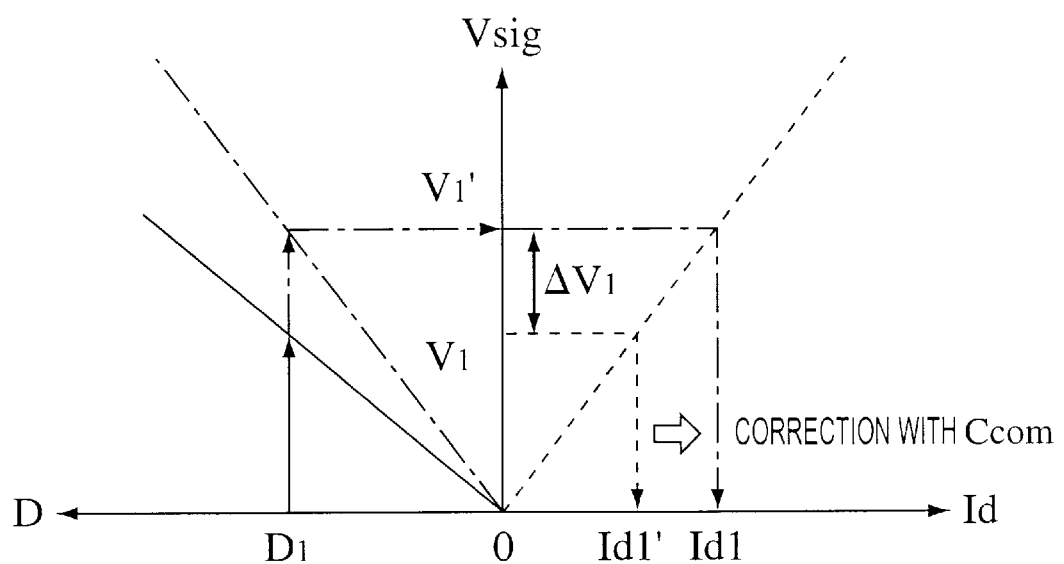

The corrective action described above according to the present embodiment will be explained with reference to FIG. 4.

First, a case where the correction according to the present embodiment is not made will be explained with reference to the upper drawing in FIG. 4. When performing pixel-displaying corresponding to a gradation level D1 of an image signal, it is assumed that the potentials of the common electrode, the opposing electrode, the voltage source of the data signal and so forth are initially set such that a driving current Id1 flows when a data signal of a voltage V1 is supplied to a signal line. Thereafter, when the organic EL device or the current TFT suffer deterioration over time, and therefore even though a data signal having the same voltage of V1 is supplied thereto, the driving current Id which flows through the organic EL device decreases (where the decreased current is defined to be Id1') Thus, performing a screen display with the voltages remaining unchanged causes luminescence of the organic EL device to decrease which emits according to the driving current Id. Next, a case where correction is made according to the present embodiment will be explained with reference to the lower drawing in FIG. 4.

In this case, even though the organic EL device 224 or the current TFT 223 suffers deterioration over time, the output voltage ($V_{oom}$) from the common electrode driving circuit 13 increases in such a manner that a same driving current Id1 as that in the initial state can be obtained for the same gradation level D1. That is, by increasing the output voltage ($V_{oom}$) from the common electrode driving circuit 13, the same driving current Id1 as that obtained for a data signal of a voltage V1' that is higher than the voltage V1 by ΔV1 flows for the image signal of the gradation level D1.

As described above, the driving current Id which flows through the organic EL device 224 is corrected by raising the output voltage ($V_{oom}$) of the common electrode driving circuit 13 in such a manner that the current characteristic for the image signal becomes like that in the initial state.

Accordingly, by performing an image display after performing correction for deterioration over time (that is, adjusting the output voltage ($V_{oom}$) of the common electrode driving circuit 13), the decrease in the luminance of the organic EL device 224 can be reduced even in case the organic EL device or the current TFT 223 suffers distinct deterioration over time.

The correction described above can be processed in real time in parallel with the display operation. Note that it is sufficient that the correction is made at certain appropriate intervals, and constant correction is not required throughout the display operation of the display apparatus 100, by taking into consideration a developing speed of deterioration over time. Hence, according to the present embodiment, the controller 23 is provided for performing correction of this type of deterioration over time, for example, at the time when a main power source of the display apparatus 100 is turned on preceding a display period or at certain regular intervals, independent of normal operations, and the output voltage level ($V_{oom}$) of the common electrode driving circuit 13 is fixed to a latest voltage level between certain correction processing and the next correction processing. The arrangement is advantageous in that correction processing does not have a bad influence over display image quality, and the processing speed or a refresh rate never reduce.

Furthermore, according to the present embodiment, because of the controller 23 being provided, the correction process by the voltage control circuit 22a, and so forth is performed while making an image display of a predetermined pattern on the display region 15, for example, a data signal is supplied which causes all organic EL devices 224 to emit light to the full extent. Thus, the current can be measured with accuracy, thereby enabling the influence due to deterioration over time to be precisely corrected.

As a result, according to the present embodiment, when deterioration over time resulting in reduced driving current Id flowing through the organic EL device 224 occurs, the decrease in the current caused by deterioration over time can be accurately corrected, and degradation of the screen luminance can be prevented.

In the present embodiment, the voltage applied to the common line 133, i.e., the voltage applied to the pixel electrode 141 is adjusted in accordance with the measured current ID flowing through the organic EL device 224. However, instead, as a modified form of the present embodiment, a voltage applied to the scanning line 131, the signal line 132 (the scanning line 131 and the signal line 132 are generally called "a bus line") or the opposing electrode (the pixel electrode 141 and the opposing electrode are generally called "electrode") may be adjusted in accordance with the current ID thus measured.

Figure 5:
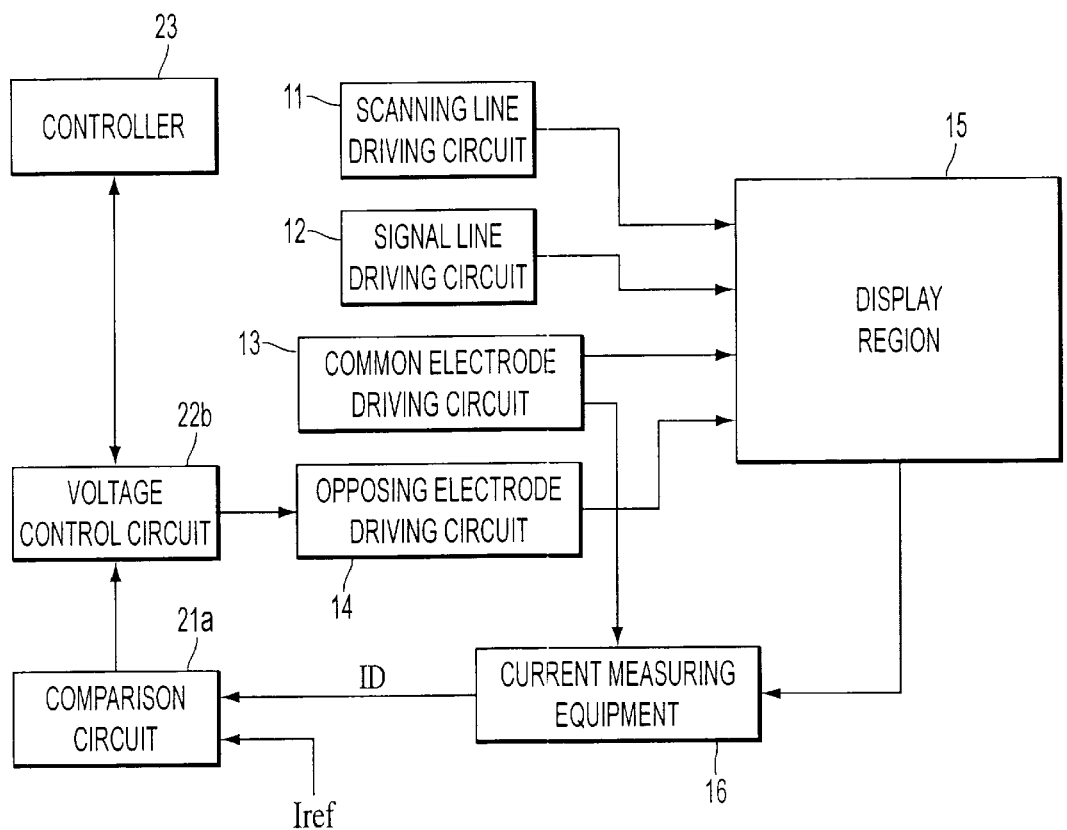
FIG. 5 is a block diagram of a modified form of the first embodiment.

That is, for example, as shown in FIG. 5, in place of the voltage control circuit 22a as shown in FIG. 3, a voltage control circuit 22b may be provided for adjusting the voltage of the opposing electrode driving circuit 14 in such a manner that the measured current ID compared in the comparison circuit 21a coincides with the reference current $I_{ref}$. This enables the same effect as that in the first embodiment described above to be achieved. Note that it goes without saying, in this case, that the grounding of the opposing electrode causes the display apparatus to be inoperative.

Figure 6:
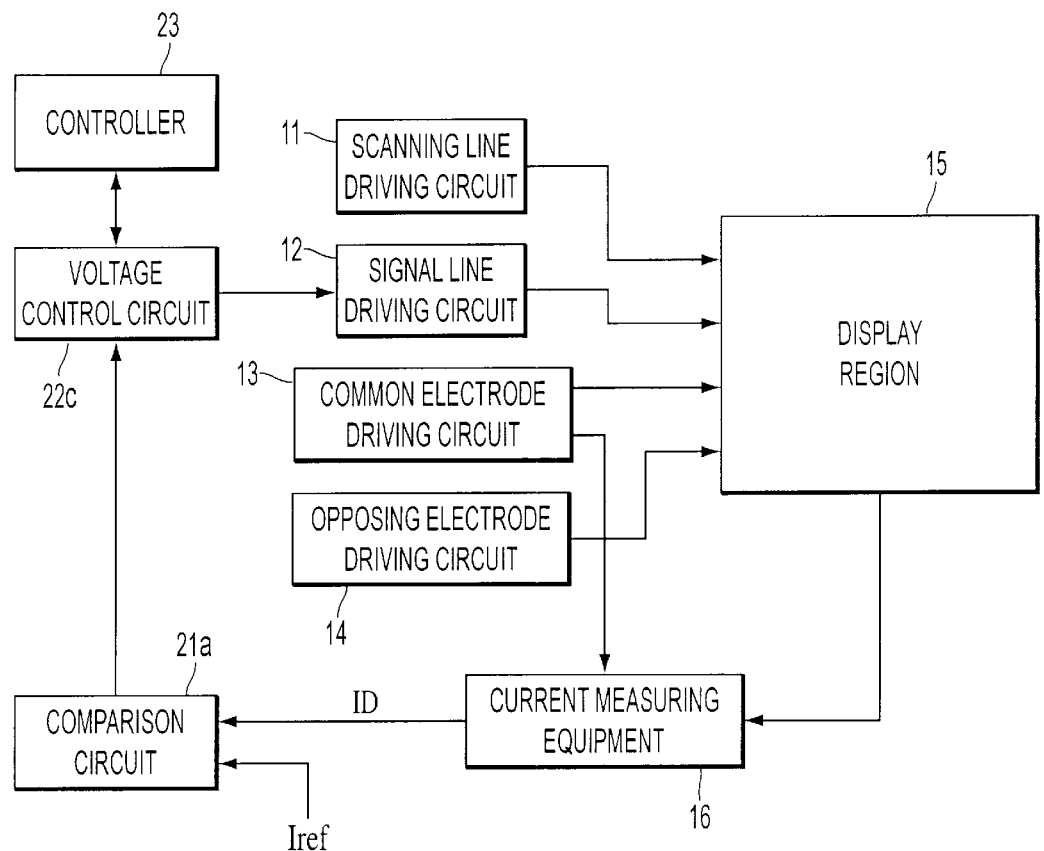
FIG. 6 is a block diagram of another modified form of the first embodiment.

Otherwise, as shown in FIG. 6, instead of the voltage control circuit 22a shown in FIG. 3, a voltage control circuit 22c may be provided for adjusting the voltage of the signal line driving circuit 12 in such a manner that the measured current ID compared in the comparison circuit 21a coincides with the reference current $I_{ref}$. This enables the same effect as that of the first embodiment described above to be achieved.

Furthermore, in the first embodiment and its modified forms, as a predetermined pattern displayed on the display region 15 for performing correction processing (voltage adjusting by the voltage control circuit 22a, etc.), for example, a pattern may be used that supplies a data signal causing all organic EL devices to emit light to the full extent as described above. Otherwise, under the control of the controller 23, voltage adjustment may be carried out by the voltage control circuit 22a and so forth by comparing the measured current ID for a plurality of patterns with each of the reference current $I_{ref}$ previously set for each of the plurality of patterns in such a manner that, for example, the total differences between both of the currents for each of the plurality of patterns are minimized.

Figure 7:
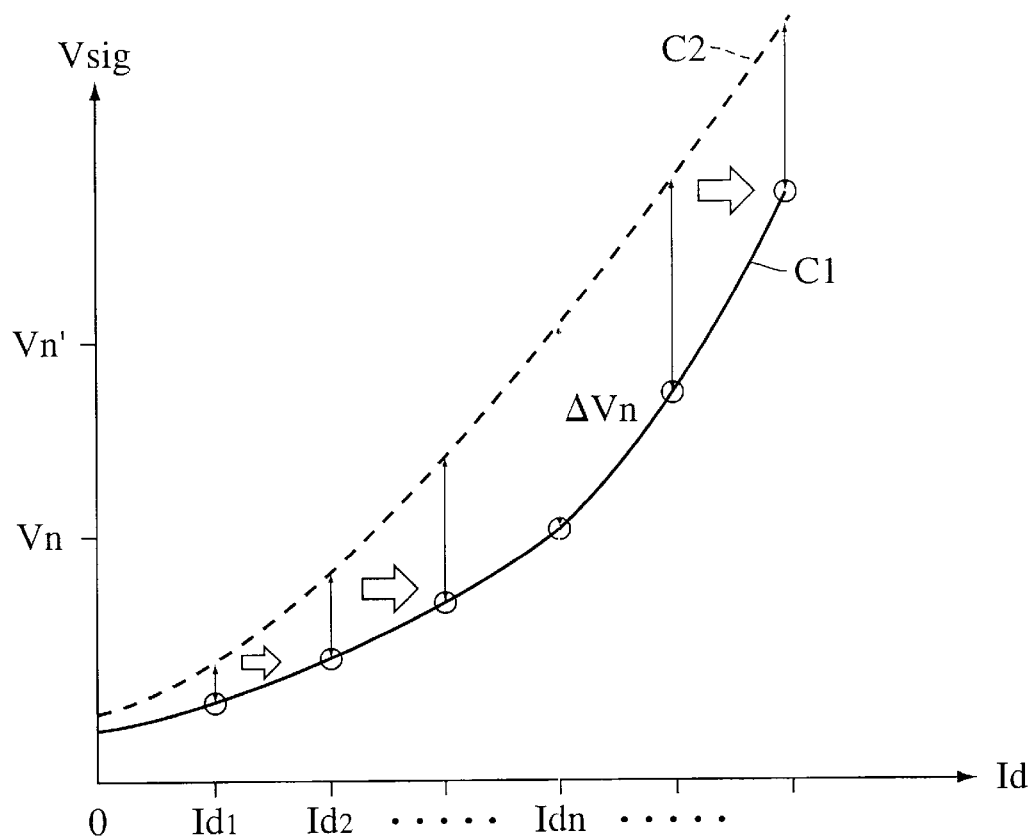
FIG. 7 is a characteristic diagram showing relation between a data signal ($V_{sig}$) and a driving current (Id) and a way of correcting deterioration for the modified form in FIG. 6.

Especially, in the modified form in which the output voltage (i.e., a voltage $V_{sig}$ of the data signal) of the signal line driving circuit 12 shown in FIG. 6 is adjusted, under the control of the controller 23, a voltage $V_{sig}$ of a data signal may be adjusted in such a manner that the measured current ID for a plurality of patterns described above coincide with the reference current $I_{ref}$, thereby, as shown in FIG. 7, enabling each voltage (Vn) of a data signal to be up to a voltage (Vn') for each of the values Id1, Id2, . . . , Idn, . . . of the driving current Id. That is, in the case where a current-voltage characteristic curve of the driving current Id for a data signal $V_{sig}$ changes in a complex way due to deterioration over time as shown by C1 and C2 (for example, in a case where a change caused by deterioration over time is extremely abrupt on the low current side comparing to the high current side, or vice versa, etc.), by determining a correction amount in accordance with each driving current Id value, the driving current Id or a quantity of emitted light in the organic EL device 224 can be precisely maintained to each gradation level of an input image signal.

As described above, according to the present embodiment and its modified forms, the voltage applied to the bus line or electrodes is controlled in accordance with a difference between the driving current (measured current ID) actually flowing through the organic EL device 224 and the predetermined reference current (reference current $I_{ref}$), thereby enabling deterioration over time of the organic EL device 224 or the current TFT 223 to be corrected.

(Second Embodiment)

Figure 8:
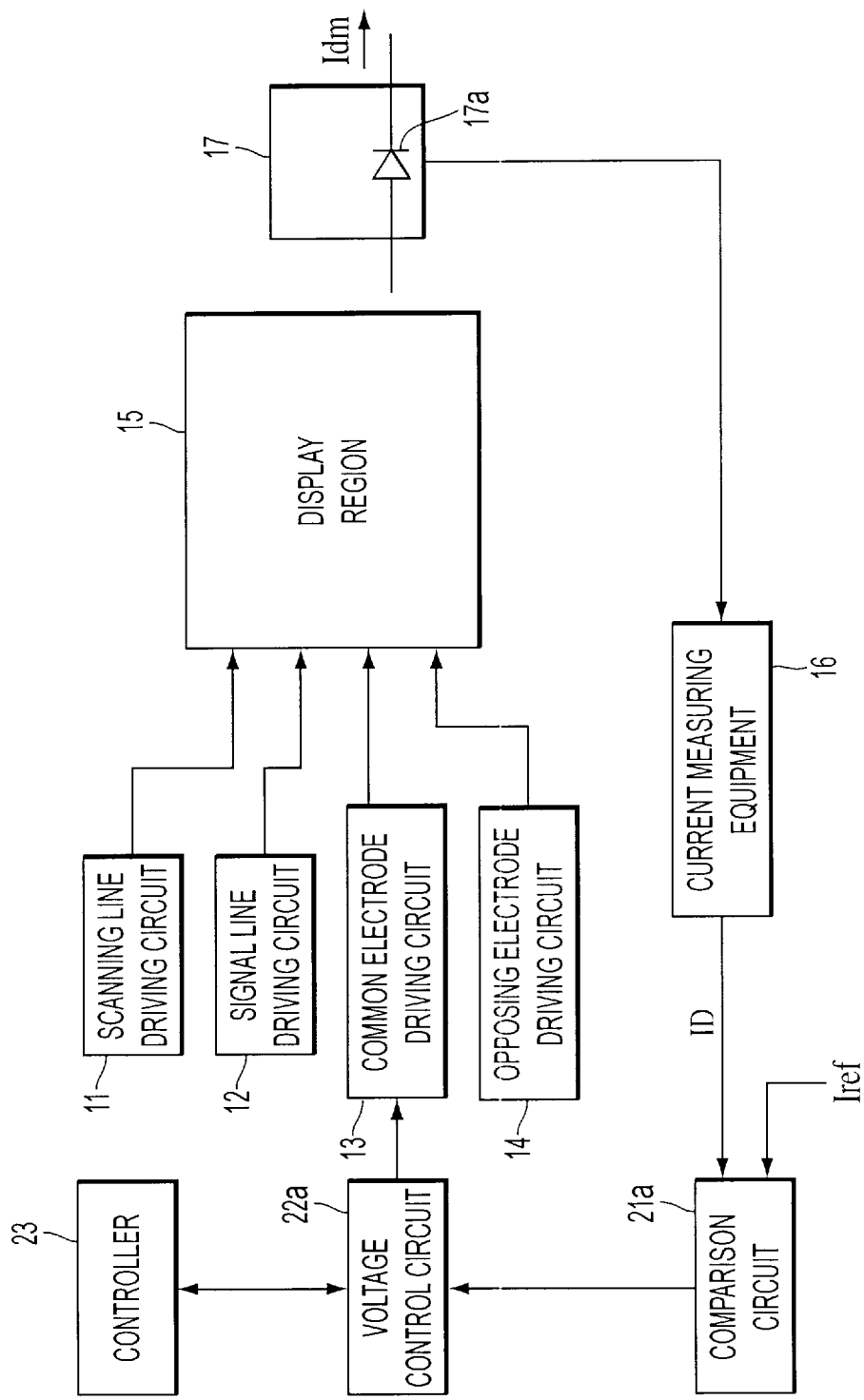
FIG. 8 is a block diagram of a display apparatus according to the second embodiment of the present invention.

FIG. 8 is a block diagram of a display apparatus equipped with a TFT-OELD according to the second embodiment of the present invention. In FIG. 8, the same components indicated in FIG. 3 as in the first embodiment are assigned the same reference symbols, and a description thereof is omitted.

In the present embodiment, a voltage between the common electrode and the opposing electrode is applied to a monitoring organic EL device 17a in a current monitoring region 17 equipped adjacent to the display region 15, and the monitoring organic EL device 17 is current-driven at a display period under almost the same conditions as for the display organic EL device 224 (refer to FIG. 1). Then, in performing a correction processing for deterioration over time, the current measuring equipment 16 measures a current $I_{dm}$ flowing through the monitoring organic EL device 17a. The output voltage ($V_{oom}$) of the common electrode driving circuit 13 is controlled by the comparison circuit 21a, the voltage control circuit 22a, and the controller 23 in such a manner that the measured current ID, which is the measured value of the current Idm by this current measuring equipment 16, is made to coincide with the reference current $I_{ref}$. The remaining portion of the configuration is the same as in the first embodiment.

According to the second embodiment configured as described above, when deterioration over time resulting in a decrease that a current of the organic EL device 224 or the current TFT 223 (refer to FIGS. 1 and 2) occurs, the decrease of the current caused by deterioration over time can be corrected, thereby enabling the decrease of the screen luminance on the display area 15 to be reduced.

Note that, in the present embodiment, a displaying organic EL device 224 and a monitoring organic EL device 17a are formed on the identical TFT array substrate 1 through an identical manufacturing step. Thus, it is not necessary to additionally perform the process of forming the monitoring organic EL device 17a. In addition, the deterioration over time tendency of each of the displaying organic EL device 224 and the monitoring organic EL device 17a can be made to become similar to each other, thereby allowing the correction of deterioration over time in the displaying organic EL device 224 to be fairly precisely made on the basis of the current Idm flowing through the monitoring organic EL device 17a.

Moreover, even in the second embodiment, like the first embodiment, correction processing for deterioration over time may be performed, for example, on power-up of the main power source of the display apparatus 100 preceding the display period, at certain predetermined intervals, or in real-time. Further, as a modified form thereof, the output voltage of the scanning line driving circuit 11, the signal line driving circuit 12, or the opposing electrode driving circuit 14 may be adjusted in accordance with the measured current ID thus measured. Especially, in the case of a modified form in which the output voltage of the signal line driving circuit 12, the monitoring organic EL device 17a, under the control of the controller 23, is driven in such a manner that a plurality of displays each having respective luminance different from one another are carried out in the current monitoring region 17. This can cope with a case where a complicated variation is generated by deterioration over time in the current-voltage characteristics by adjusting the voltage $V_{sig}$ of the data signal in such a manner that each measured current ID obtained for each luminance is made to coincide with each corresponding reference current $I_{ref}$.

(Third Embodiment)

Figure 9:
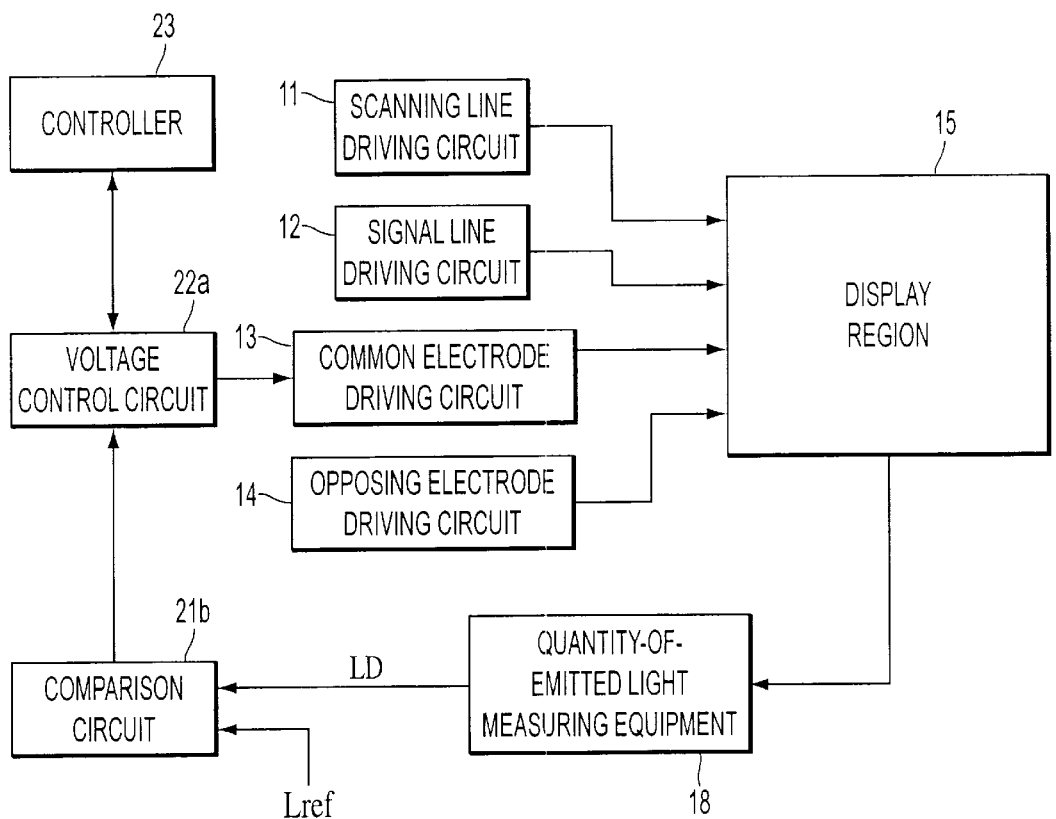
FIG. 9 is a block diagram of a display apparatus according to the third embodiment of the present invention.

FIG. 9 is a block diagram of a display apparatus equipped with a TFT-OELD according to a third embodiment of the present invention. In FIG. 9, the same components indicated in FIG. 3 as in the first embodiment are assigned the same reference symbols and a description thereof is omitted.

In the present embodiment, in place of the current measuring equipment 16 in the first embodiment, a quantity-of-emitted-light measuring equipment 18 is provided to measure a quantity of emitted light of the displaying organic EL device 224 (refer to FIG. 1) in the display region 15. In correcting deterioration over time, the scanning signal of a predetermined voltage from the scanning line driving circuit 11, the data signal of a predetermined voltage from the signal line driving circuit 12, and the power source signal of a predetermined voltage from the common electrode driving circuit 13 and the opposing electrode driving circuit 14 are applied. The quantity-of-emitted-light measuring equipment 18 detects the light emitted according thereto from the organic EL device 224. The comparison circuit 21b compares the measured quantity of emitted light LD to a predetermined reference quantity of emitted light $L_{ref}$. Then, the output voltage of the common electrode driving circuit 13 is adjusted by the comparison circuit 21b, the voltage control circuit 22a, and the controller 23 in such a manner that the quantity of emitted light LD to be compared is made to coincide with the predetermined reference quantity of emitted light $L_{ref}$. The other portions of this embodiment are the same as those in the first embodiment.

In the third embodiment as described above, deterioration over time of several types occurs, such as a decrease in a drain current (the driving current) for a gate voltage in the current TET 223 (refer to FIGS. 1 and 2), a decrease in current for a voltage in the organic EL device 224, a decrease in quantity of emitted light in the organic EL device 224, finally resulting in a decrease in quantity of emitted light. At this time, a decreased quantity of emitted light caused by deterioration over time can be corrected by increasing the voltage applied to the organic EL device 224 to thereby prevent the screen luminance in the display region 15 from being reduced.

In the third embodiment also, like the first embodiment, correction for deterioration over time may be made, for example, at the power-up of the main power source of the display apparatus 100 preceding the display period, at certain predetermined intervals, or in real-time. Further, as a modified form of the third embodiment, the output voltages of the scanning line driving circuit 11, the signal line driving circuit 12, or the opposing electrode driving circuit 14 may be adjusted according to the quantity of emitted light LD thus measured. As a predetermined pattern used for correcting deterioration over time, one kind of pattern or a plurality of patterns are acceptable. Especially, in the modified form for adjusting the output voltage of the signal line driving circuit 12, under the control of the controller 23, by adjusting the voltage $V_{sig}$ of the data signal in such a manner that, for a plurality of predetermined patterns, the measured quantity of emitted light LD is made to coincide with each corresponding reference quantity of emitted light $L_{ref}$, complicated variations of the current-voltage characteristics resulting from deterioration over time can be dealt with.

(Fourth Embodiment)

Figure 10:
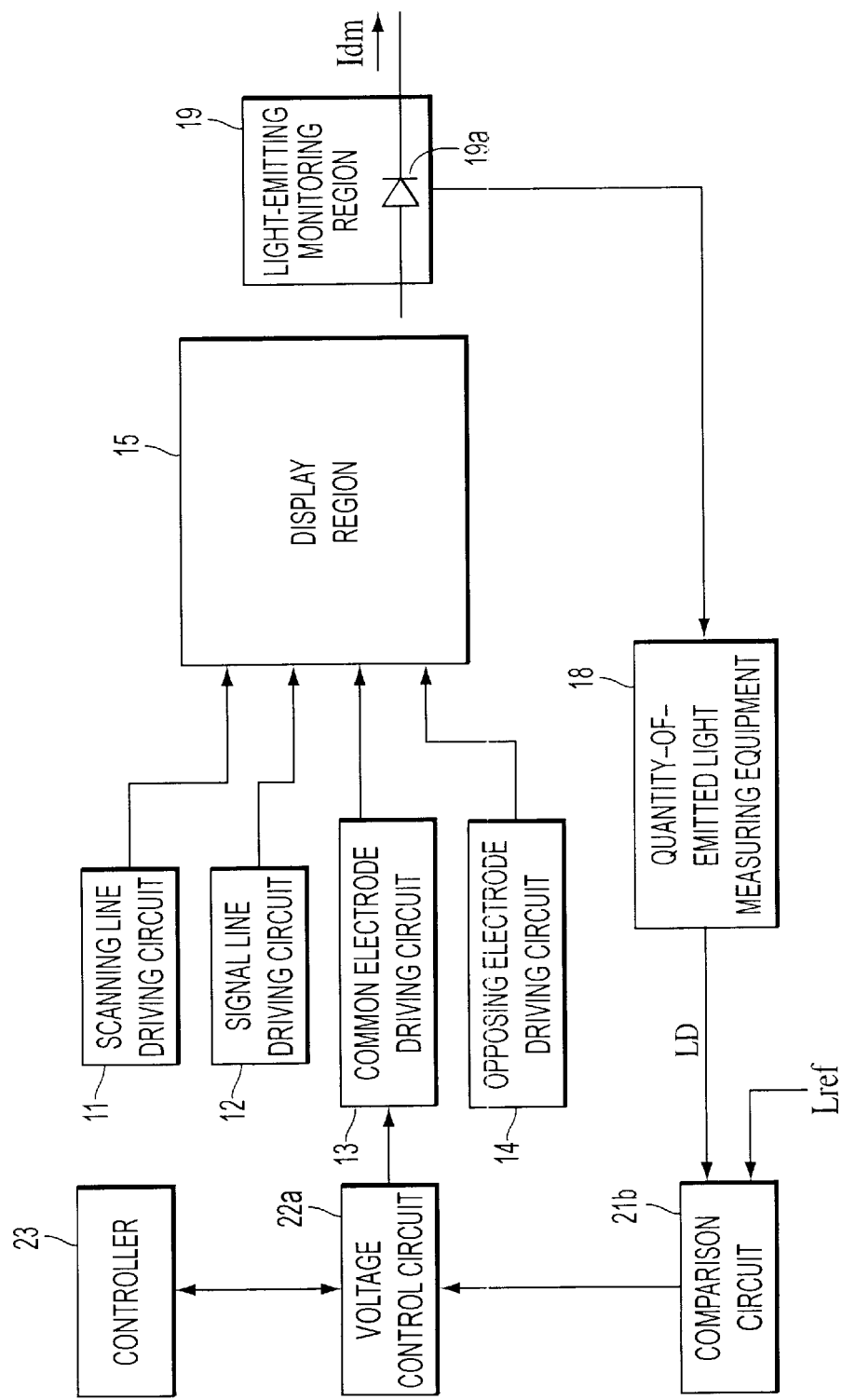
FIG. 10 is a block diagram of a display apparatus according to the fourth embodiment of the present invention.

FIG. 10 is a block diagram of a display apparatus provided with a TFT-OELD according to the fourth embodiment of the present invention. In FIG. 10, the same components indicated in FIGS. 3 and 9 as in the first and third embodiments are assigned the same reference symbols, and a description thereof is omitted.

In the present embodiment, a voltage between the common electrode and the opposing electrode is applied to a monitoring organic EL device 19a in a light-emitting monitoring region 19 equipped adjacent to the display region 15, and the monitoring organic EL device 19a is current-driven under almost the same conditions as for the display organic EL device 224 (refer to FIG. 1). Then, in performing a correction processing for deterioration over time, the quantity-of-emitted-light measuring equipment 18 measures the quantity of emitted light from the monitoring organic EL device 19a. The output voltage ($V_{oom}$) of the common electrode driving circuit 13 is adjusted by the comparison circuit 21b, the voltage control circuit 22a, and the controller 23 in such a manner that the measured quantity of emitted light LD which is the measured value of emitted light by this quantity-of-emitted-light measuring equipment 18, coincides with the reference quantity of emitted light $L_{ref}$. The remaining portion of the configuration is the same as in the first embodiment.

According to the fourth embodiment configured as described above, like the case in the third embodiment, when deterioration over time resulting in a decrease in a quantity of current to a voltage of the organic EL device 224 or the current TFT 223 (refer to FIGS. 1 and 2), and a decrease in a quantity of emitted light to the driving current of the organic EL device 224 occurs, and when a decrease in a quantity of emitted light in the organic EL device 224 finally occurs, the decrease of the quantity of emitted light can be corrected, thereby enabling the decrease of a screen luminance in the display area 15 to be prevented from decreasing.

Moreover, even in the fourth embodiment, like the first embodiment, correction processing for deterioration over time may be performed, for example, on power-up of the main power source of the display apparatus 100 preceding the display period, at certain predetermined intervals, or in real-time. Further, as a modified form thereof, the output voltage of the scanning line driving circuit 11, the signal line driving circuit 12, or the opposing electrode driving circuit 14 may be adjusted in accordance with the measured quantity of emitted light LD thus measured. As a predetermined pattern used for correcting deterioration over time, one kind of pattern or a plurality of patterns are acceptable. Especially, in the modified form in which the output voltage of the signal line driving circuit 12 is adjusted, under the control of the controller 23, , the voltage $V_{sig}$ of a data signal is adjusted such that measured quantity of emitted light LD coincides with each corresponding reference quantity of emitted light $L_{ref}$ with respect to a plurality of predetermined patterns, thereby enabling a complicated variation of current-voltage characteristics resulting from deterioration over time to be dealt with.

Note that, in the present invention, especially the displaying organic EL device 224 and the monitoring organic EL device 19a are formed on an identical TFT array substrate 1 through an identical process. Accordingly, it is not required to separately provide a process to form the monitoring organic EL device 19a. In addition, the deterioration over time tendency in the displaying organic EL device 224 and the monitoring organic EL device 19a can be made similar, thus enabling deterioration over time of the current driven displaying organic EL device 224 to be accurately corrected based on the emitted light from the monitoring EL device 19a.

(Fifth Embodiment)

Unlike the first through the fourth embodiments described above, the fifth through the tenth embodiments which will be explained hereinafter relates to a pixel circuit for making correction for each pixel. The pixel circuit corrects a decrease in the driving current in the organic EL device 224 or the current TFT 223 caused by deterioration over time or a decrease in a quantity of emitted light in the organic EL device 224, which occurs for each pixel.

For the fifth embodiment through the tenth embodiment, the arrangement of the display apparatus in which the plurality of pixel circuits are provided for respective pixels is the same as that shown in FIG. 1, and thus the description thereof is omitted.

Figure 11:
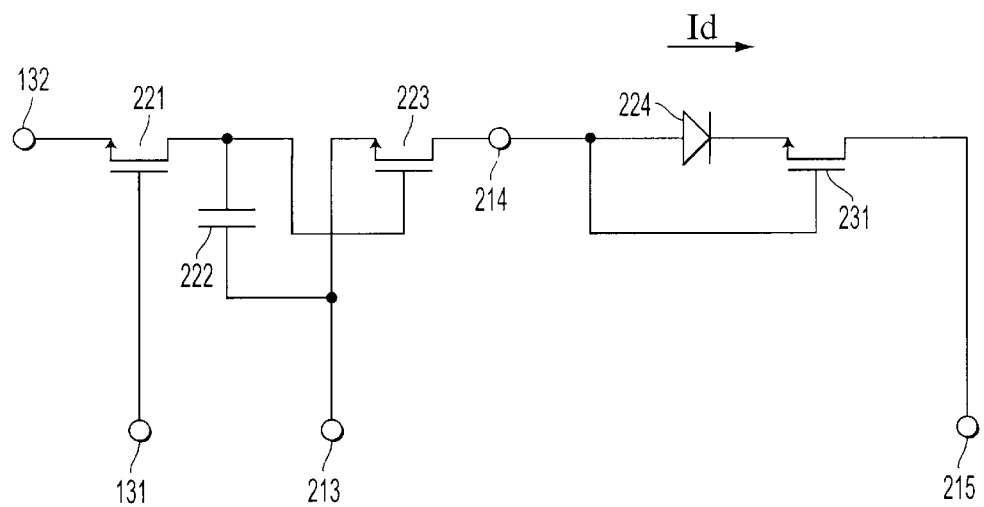
FIG. 11 shows an equivalent circuit diagram for a pixel of a display apparatus according to the fifth embodiment of the present invention.

FIG. 11 shows an equivalent circuit diagram of the pixel circuit configured including a TFT-OELD according to the fifth embodiment of the present invention. Note that, in FIG. 11, the same components as those shown in the circuit diagram in each pixel 10 of FIG. 1 are assigned the same reference symbols, and the description thereof is omitted.

In FIG. 11, in the pixel circuit according to the present embodiment, a resistance between the first feeder line 213 and the second feeder line 215 is made to change depending upon a relationship between a voltage across both edges of the organic EL device 224 and a driving current Id flowing therethrough. Note that the first feeder line 213 referred to here is a common portion connected to the pixel electrode in each pixel to which a power source signal of a predetermined voltage is supplied from the common line driving circuit. On the other hand, the second feeder line 215 is a feeder line portion connected to the opposing electrode in each pixel to which a power source signal of a predetermined voltage is supplied from the opposing electrode driving circuit.

More specifically, when an electric potential of the first feeder line (common electrode) 213 is set to be higher than an electric potential of the second feeder line (opposing electrode) 215, (that is, in this case a positive voltage is supplied to the common electrode, and a negative voltage is supplied to the opposing electrode), as shown in FIG. 11, for a first correction TFT 231 of the n-channel type, a gate electrode thereof is connected to the electrode on the first feeder line side of the organic EL device 224, a source electrode and a drain electrode are added between the organic EL device 224 and the second feeder line 215 as to be serially connected with the organic EL device 224. According to this configuration, when a resistance of the organic EL device 224 increases, the gate voltage of the first correction TFT 231 increases, and the resistance between the source electrode and the drain electrode decreases.

Hence, according to the fifth embodiment, even if a resistance of the organic EL device 224 increases due to deterioration over time, a resistance between the source and the drain of the first correction TFT 231 decreases, thereby enabling a decrease in a quantity of driving current Id resulting from a increase in a resistance in the organic EL device 224 to be corrected, and the screen luminance to be prevented from decreasing. In addition, the correction described above is made for each of the pixels. This prevents screen irregularities from occurring when deterioration over time occurs to various degrees among a plurality of pixels or there are various degrees of variation in current-voltage characteristics among a plurality of pixels in the initial state.

As a modified form of the fifth embodiment, an electric potential of the first feeder line 213 is set to lower than that of the second feeder line 215 (that is, a negative power source is supplied to the common electrode, and a positive power source is supplied to the opposing electrode.), the first correction TFT 231 is a p-channel type, and a gate electrode thereof is connected to the electrode on the first feeder line side of the organic EL device 224 and a source electrode and a drain electrode have only to be comprised between the organic EL device 224 and the second feeder line 215 as to be serially connected with the organic EL device. According to this configuration, when a resistance of the organic EL device 224 increases, the gate voltage of the first correction TFT 231 lowers, and a resistance between the source electrode and the drain electrode decreases, thereby automatically making correction.

According to the present embodiment, the switching TFT 221, the current TFT 223, and the first correction TET 231 are preferably formed on an identical TFT array substrate through an identical manufacturing step. The arrangement described above enables a reduction in the driving current Id caused by deterioration over time to be corrected for each pixel without increasing the manufacturing step.

(Sixth Embodiment)

Figure 12:
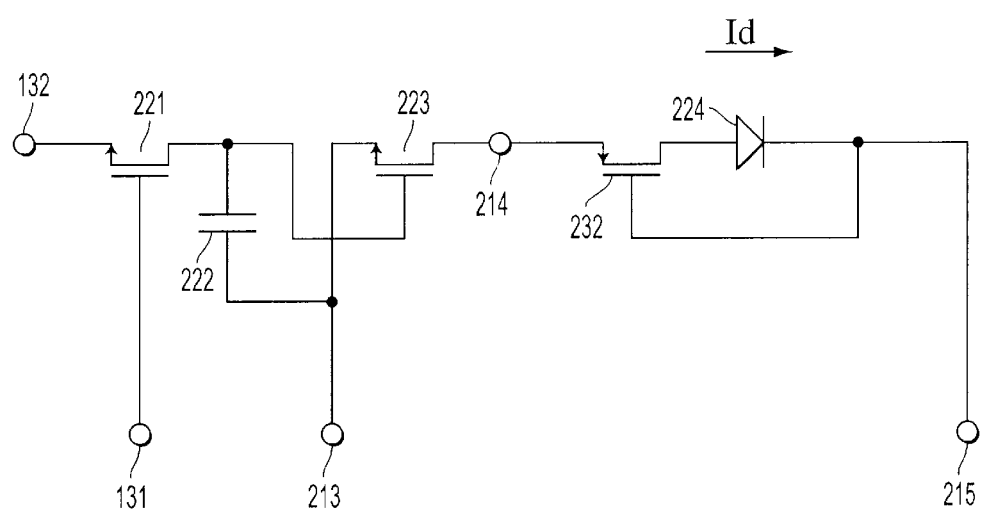
FIG. 12 shows an equivalent circuit diagram for a pixel of a display apparatus according to the sixth embodiment of the present invention.

FIG. 12 shows an equivalent circuit diagram of a pixel circuit configured with a TFT-OELD included therein according to a sixth embodiment of this invention. In FIG. 12, the same components as in FIGS. 1 and 11 are assigned to the same reference symbols, and the description thereof is omitted.

In the pixel circuit according to the present embodiment shown in FIG. 12, a resistance between the first feeder line 213 and the second feeder line 215 is made to change depending upon a relationship between a voltage across both edges of the organic EL device 224 and a quantity of driving current Id which flows therethrough.

More specifically, when an electric potential of the first feeder line 213 is set to be higher than that of the second feeder line 215, as shown in FIG. 12, the second correction TFT 232 is a p-channel type, and the gate electrode thereof is connected to an electrode on the second feeder line side of the organic EL device 221, and its source and drain electrodes are connected between the organic EL device 224 and the first feeder line so as to be serially connected to the organic EL device 224. According to this configuration, when a resistance of the organic EL device 224 increases, the gate voltage of the second correction TFT 232 decreases, and a resistance between the source electrode and the drain electrode decreases.

Hence, according to the sixth embodiment, even if a resistance of the organic EL device 224 increases due to deterioration over time, a reduction in a quantity of driving current Id resulting from a increase in a resistance of the organic EL device 224 can be corrected by a decrease in a resistance between the source and the drain of the second correction TFT 232, thereby enabling a reduction in screen luminance to be prevented. In addition, since the correction described above is made for each pixel, when deterioration over time occurs to various degrees among a plurality of pixels or there are various degrees of variation in current-voltage characteristics in the initial state among a plurality of pixels, it enables screen irregularities to be suppressed.

As a modified form of the sixth embodiment, when an electric potential of the first feeder line 213 is set to be lower than an electric potential of the second feeder line 215, an n-channel type TFT is used for the second correction TET 232, and the gate thereof is connected to the second feeder line side of the organic EL device 224 and the source electrode and the drain electrode have only to be connected in series to the organic EL device 224 between the organic EL device 224 and the first feeder line. In this configuration, when a resistance of the organic EL device 224 increases, the gate voltage of the second correction TFT 232 increases, and a resistance between the source electrode and the drain electrode decreases, thereby automatically making correction.

According to the present embodiment, the switching TFT 221, the current TFT 223, and the second correction TFT 232 are preferably formed on an identical TFT array substrate through an identical manufacturing step. The arrangement described above enables a reduction in the driving current Id resulting from deterioration over time to be corrected for each pixel without increasing the manufacturing steps.

(Seventh Embodiment)

Figure 13:
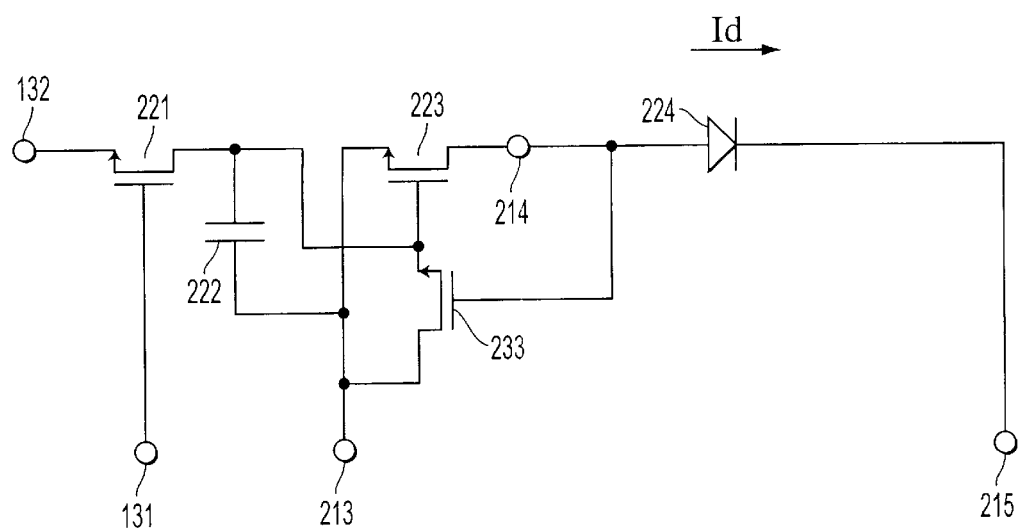
FIG. 13 shows an equivalent circuit diagram for a pixel of a display apparatus according to the seventh embodiment of the present invention.

FIG. 13 shows an equivalent circuit diagram configured with a TFT-OELD included therein according to a seventh embodiment of the present invention. In FIG. 13, the same components as in FIGS. 1 and 11 are assigned the same reference symbols, and the description thereof is omitted.

In a pixel circuit according to the present embodiment, as shown in FIG. 13, a resistance between the retention capacitor 222 and the first feeder line 213 is changed depending upon a relationship between a voltage across both edges of the organic EL device 224 and a quantity of driving current Id which flows therethrough.

More specifically, when an electric potential of the first feeder line 213 is higher than an electric potential of the second feeder line 215, as shown in FIG. 13, for an n-channel type third correction TFT 233 equivalent to the current TFT 223, the gate electrode thereof is connected to an electrode on the first feeder line side of the organic EL device 224, and the source and drain electrodes are connected between the retention capacitor 222 and the first feeder line 213.

According to the configuration, when a resistance of the organic EL device 224 increases, the gate voltage of the third correction TFT 233 increases, and a resistance between its source and drain electrodes decreases. For this reason, the gate voltage of the current TFT 223 increases, and a resistance between its source and drain electrodes decreases.

Thus, according to the seventh embodiment, even if a resistance of the organic EL device 224 increases due to deterioration over time, a resistance between the source and the drain electrodes of the third correction TFT 233 decreases, thus enabling a decrease in a quantity of driving current ID due to an increase in a resistance of the organic EL device 224 to be corrected and a decrease of a screen luminance to be prevented. In addition, since the correction described above is made for each pixel, when deterioration over time occurs to various degrees among a plurality of pixels or there are various degrees of variation among a plurality of pixels in current-voltage characteristics in the initial state, screen irregularities are thereby suppressed.

As a modified form of the seventh embodiment, when an electric potential of the first feeder line 213 is higher than that of the second feeder line 215, it may be arranged that a p-channel type TFT is used for the current TFT 223, a p-channel type TFT is used for the third correction TFT 233, and the gate electrode is connected to an electrode on the first feeder line side of the organic EL device 224, and the source and drain electrodes are connected between the retention capacitor 222 and the first feeder line 213. According to this configuration, when a resistance of the organic EL device 224 increases, the gate voltage of the third correction TFT 233 increases, and a resistance between its drain and source voltages increases. For this reason, the gate voltage of the current TFT 223 decreases, and a resistance between its source and drain decreases, thereby automatically making a correction.

Additionally, as another modified form of the seventh embodiment, when an electric potential of the first feeder line 213 is lower than that of the second feeder line 215, an n-channel type TFT may be used for the current TFT 223, an n-channel type TFT may be used for the third correction TFT 233, and the gate electrode thereof may be connected to an electrode on the first feeder line side of the organic EL device 224, and its source and drain electrodes may be connected between the retention capacitor 222 and the first feeder line 213. In this configuration, when a resistance of the organic EL device 224 increases, the gate voltage of the third correction TFT 233 decreases, and a resistance between its source and drain electrodes increases. For this reason, the gate voltage of the current TFT 223 increases, and a resistance between its source and drain electrodes decreases, thereby automatically making correction.

Furthermore, as another modified form of the seventh embodiment, when an electric potential of the first feeder line 213 is lower than that of the second feeder line 215, it may be configured that a p-channel type TFT is used for the current TFT 223, and a p-channel type TFT is used for the third correction TFT 233 and the gate electrode is connected to an electrode on the first feeder line side of the organic EL device 224, and the source and drain electrodes are connected between the retention capacitor 222 and the first feeder line 213.

According to this configuration, when a resistance of the organic EL device 224 increases, the gate voltage of the third correction TET 233 decreases, and a resistance between its source and drain electrodes decreases. For this reason, the gate voltage of the current TET 223 decreases, followed by a resistance between its source and drain electrodes being reduced, thereby automatically making a correction.

According to the present embodiment, the switching TFT 221, the current TFT 223, and the third correction TFT 233 are preferably formed on an identical TFT array substrate through an identical manufacturing process. According to this configuration, the number of manufacturing processes is not increased, and a decrease in the driving current Id due to deterioration over time can be corrected for each pixel.

(Eighth Embodiment)

Figure 14:
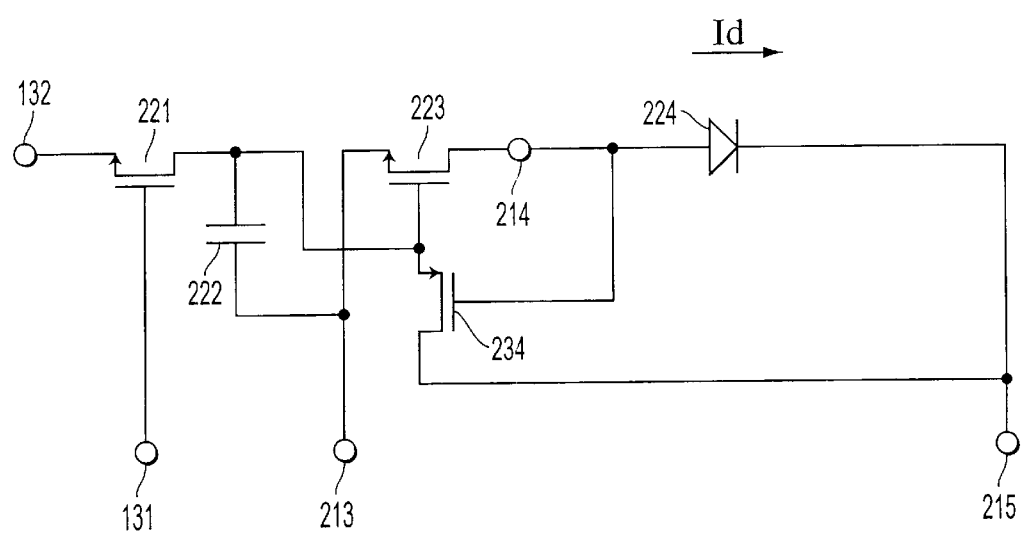
FIG. 14 shows an equivalent circuit diagram for a pixel of a display apparatus according to the eighth embodiment of the present invention.

FIG. 14 shows an equivalent circuit diagram of a pixel circuit configured with a TFT-OELD included therein according to an eighth embodiment of the present invention. In FIG. 14, the same components as in FIGS. 1 and 11 are assigned the same reference symbols, and the description thereof is omitted. In the pixel circuit according to the present embodiment, as shown in FIG. 14, a resistance between the retention capacitor 222 and the second feeder line 215 is changed depending upon the relationship between a voltage across both edges of the organic EL device 224 and a quantity of driving current Id which flows therethrough.

More specifically, when an electric potential of the first feeder line 213 is higher than an electric potential of the second feeder line 215, as shown in FIG. 14, for a p-channel type fourth correction TFT 234 in contrast to the n-channel type current TFT 223, the gate electrode is connected to an electrode on the first feeder line side of the organic EL device 224 and its source and drain electrodes are connected between the retention capacitor 222 and the second feeder line 215. According to this configuration, when a resistance of the organic EL device 224 increases, the gate voltage of the fourth correction TFT 234 increases, and a resistance between its source and drain electrodes increases. For this reason, the gate voltage of the current TFT 223 increases, and a resistance between its source and drain electrodes decreases.

Thus, according to the eighth embodiment, even if a resistance of the organic EL device 224 increases due to deterioration over time, and a resistance between the source and the drain of the fourth correction TFT 234 increases, a decrease in a quantity of driving current Id due to a increase in a resistance of the organic EL device 224 can be corrected and a decrease of a screen luminance can be decreased. In addition, since the correction described above is made for each pixel, when deterioration over time occurs to various degrees among a plurality of pixels or there are various degrees of variation among a plurality of pixels in current-voltage characteristics in the initial state screen irregularities are thereby suppressed.

As a modified form of the eighth embodiment, when an electric potential of the first feeder line 213 is higher than that of the second feeder line 215, it may be arranged that a p-channel type TFT is used for the current TFT 223, an n-channel type TFT is used for the fourth correction TFT, and the gate electrode thereof is connected to an electrode on the first feeder line side of the organic EL device 224 and the source and the drain electrodes are connected between the retention capacitor 222 and the second feeder line 215. According to this configuration, when a resistance of the organic EL device 224 increases, the gate voltage of the fourth correction TET 234 increases, and a resistance between the drain and the source electrodes decreases. For this reason, the gate voltage of the current TET 223 decreases, and a resistance between its source and drain electrodes decreases, thereby automatically making a correction.

Additionally, as another modified form of the eighth embodiment, when an electric potential of the first feeder line 213 is lower than that of the second feeder line 215, an n-channel type TFT is used for the current TFT 223, and a p-channel type TFT is used for the fourth correction TFT and its gate electrode is connected to an electrode on the first feeder side of the organic EL device 224, and its source and drain electrodes are connected between the retention capacitor 222 and the second feeder line 215. In this configuration, when a resistance of the organic EL device 224 increases, the gate voltage of the fourth correction TET 234 decreases, and a resistance between the source and the drain electrodes decreases. For this reason, the gate voltage of the current TFT 223 increases, followed by a resistance between its source and drain electrodes being reduced, thereby automatically making correction.

Furthermore, as another modified form of the eighth embodiment, when an electric potential of the first feeder line 213 is lower than that of the second feeder line 215, it may be configured that a p-channel TFT is used for the current TFT 223 and an n-channel type TFT is used for the fourth correction TFT 234 and its gate electrode is connected to an electrode on the first feeder line side of the organic EL device 224, and the source and drain electrodes are connected between the retention capacitor 222 and the second feeder line 215.

According to this configuration, a resistance of the organic EL device 224 increases, the gate voltage of the forth correction TFT 234 decreases, and a resistance between the source and the drain electrodes decreases. For this reason, the gate voltage of the current TFT 223 increases, and a resistance between the source and drain electrodes thereof decreases, thereby automatically making correction.

Furthermore, another modified form of the eighth embodiment is explained next. In this case, an electric potential of the first feeder line 213 is lower than that of the second feeder line 215. Thus, it may be configured that a p-channel type TFT is used for the current TFT 223, and an n-channel type TFT is used for the fourth correction TFT 234, whose gate electrode is connected to an electrode on the first feeder side of the organic EL device 224 and the source and drain electrodes are connected between the retention capacitor 222 and the second feeder line 215.

According to this configuration, an increase in a resistance of an organic EL device 224 causes the gate voltage of the fourth correction TFT 234 to decrease, leading to a increase in a resistance between the source electrode and drain electrode. For this reason, the gate voltage of the current TFT 223 decreases, and a resistance between its source and drain electrodes decreases, thereby automatically making a correction.

According to the present embodiment, the switching TET 221, the current TET 223, and the fourth correction TFT 234 are preferably formed on an identical TFT array substrate through the identical manufacturing processes. According to the arrangement, the number of the manufacturing processes does not increase, and the increase in the driving current Id caused by deterioration over time can be corrected for each pixel.

(Ninth Embodiment)

Figure 15:
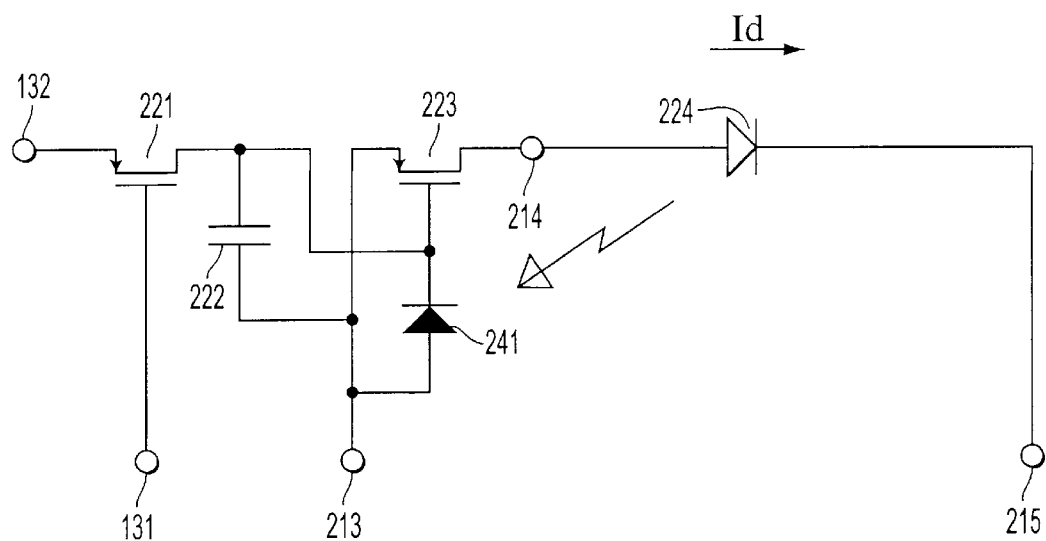
FIG. 15 shows an equivalent circuit diagram for a pixel of a display apparatus according to the ninth embodiment of the present invention.

FIG. 15 shows an equivalent circuit diagram configured with a TFT-OFLD included therein according to the ninth embodiment of the present invention. In FIG. 15, the same components as in FIGS. 1 and 11 are assigned the same reference symbols,.and the description thereof is omitted.

In FIG. 15, a first correction thin film photodiode 241 provided for a pixel circuit in the present embodiment has a characteristic of reduced resistance by irradiation with light.

In the present embodiment, a resistance between the retention capacitor 222 and the first feeder line 213 is changed depending upon a relationship between a voltage across both edges of the organic EL device 224 and a quantity of emitted light.

More specifically, when an electric potential of the first feeder line 213 is higher than that of the second feeder line 215, as shown in FIG. 15, although a p-channel type TFT is used for the current TFT 223, the first correction thin film photodiode 241 is connected between the retention capacitor 222 and the first feeder line 213. According to the configuration, when a quantity of emitted light of the organic EL device 224 decreases, a resistance of the first correction thin film photodiode 241 increases. For this reason, for the current TFT 223, its gate voltage decreases, and a resistance between its source and drain electrodes reduces.

Thus, according to the ninth embodiment, even if a quantity of emitted light of the organic EL device 224 decreases due to deterioration over time, a resistance of the first correction thin film photodiode 241 increases, thus enabling a decrease in a quantity of emitted light of the organic EL device 224 to be corrected. In addition, since the correction described above is made for each pixel, when deterioration over time occurs to various degrees among a plurality of pixels or there are various degrees of variation among a plurality of organic EL devices in light-emitting characteristics in the initial state, screen irregularities are thereby suppressed.

In this connection, as a modification of the ninth embodiment, for the fifth correction TFT( not shown), its source and drain electrodes thereof may be connected between the retention capacitor 222 and the first feeder line 213.

As another modified form of the ninth embodiment, when an electric potential of the first feeder line 213 is lower than that of the second feeder line 215, an n-channel type TFT is used for the current TFT 223, and the first correction thin film photodiode 241 may be connected between the retention capacitor 222 and the first feeder line 213. Further, in this case, for the fifth correction TFT (not shown), the source and drain electrodes thereof may be connected between the retention capacitor and the first feeder line 213. According to this configuration, when a quantity of emitted light of the organic EL device 224 decreases, a resistance of the first correction thin film photodiode 241 increases, and further, the gate voltage of the current TFT 223 rises, and a resistance between its source and drain electrodes decreases, thereby automatically making correction.

In the present embodiment, the switching TFT 221, the current TFT 223, and the first correction thin film photodiode 241 are preferably configured on an identical TFT array substrate through an identical manufacturing process.

According to this configuration, a decrease of the driving current Id caused by deterioration over time can be corrected for each pixel without increasing the number of manufacturing processes.

(Tenth Embodiment)

Figure 16:
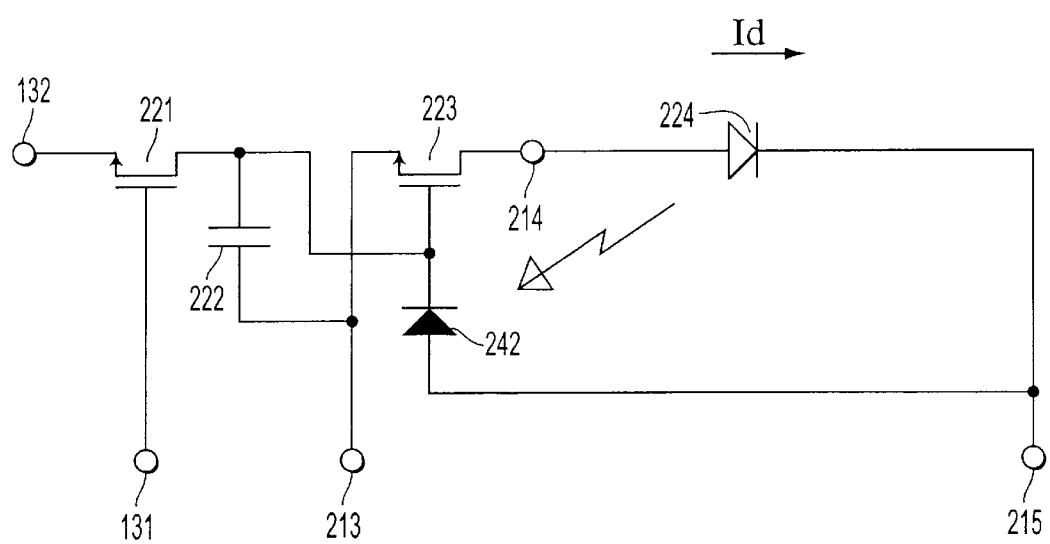
FIG. 16 shows an equivalent circuit diagram for a pixel of a display apparatus according to the tenth embodiment of the present invention.

FIG. 16 shows an equivalent circuit diagram configured with a TFT-OELD included therein according to the tenth embodiment of the present invention. In FIG. 16, the same components as in FIGS. 1 and 11 are assigned the same reference symbols, and the description thereof is omitted.

In FIG. 16, the second correction thin film photodiode 242 provided for the pixel circuit in the present embodiment has a characteristic of reduced resistance by irradiation with light.

In the present embodiment, a resistance between the retention capacitor 222 and the second feeder line 215 is changed depending upon a relationship between a voltage across both edges of the organic EL device 224 and a quantity of emitted light.

More specifically, when an electric potential of the first feeder line 213 is higher than that of the second feeder line 215, as shown in FIG. 16, although an n-channel type TFT is used for the current TFT 223, the second correction thin film photodiode 242 is connected between the retention capacitor 222 and the second feeder line 215. According to this configuration, when a quantity of emitted light of the organic EL device 224 decreases, a resistance of the second correction thin film photodiode 242 increases. For this reason, the gate voltage of the current TET 223 increases, and a resistance between its source and drain electrodes decreases.

Thus, according to the tenth embodiment, even if a quantity of emitted light of the organic EL device 224 decreases due to deterioration over time, a resistance of the second correction thin film photodiode 242 increases, thereby enabling a reduction in a quantity of emitted light in the organic EL device 224 to be corrected. In addition, since the correction described above is made for each pixel, when deterioration over time occurs to various degrees among a plurality of pixels or there are various degrees of variation in light-emitting characteristics among a plurality of organic EL devices in the initial state, screen irregularities are thereby suppressed.

As a modified form of the tenth embodiment, for the sixth correction TFT (not shown), its source and drain electrodes thereof may be connected between the retention capacitor and the second feeder line 215.

As another modified form of the tenth embodiment, when an electric potential of the first feeder line 213 is lower than that of the second feeder line 215, a p-channel type TFT may be used for the current TFT 223, and the second correction thin film photodiode 242 may be connected between the retention capacitor 222 and the second feeder line 215. Further, in this case, a sixth correction TFT( not shown), may be connected between the retention capacitor 222 and the second feeder line 215.

According to this configuration, when a quantity of emitted light of the organic EL device 224 decreases, a resistance of the second correction thin film photodiode 242 increases. Further, the gate voltage of the current TFT 223 decreases, and a resistance between its source and drain electrodes decreases, thereby automatically making a correction.

In the present embodiment, the switching TFT 221, the current TFT 223, and the second correction thin film photodiode 242 are preferably formed on an identical TET array substrate through an identical manufacturing process. According to this configuration, a decrease in the driving current Id due to deterioration over time can be corrected for each pixel without increasing the number of manufacturing processes.

(Eleventh Embodiment)

Next, the eleventh embodiment according to the present invention will be described with reference to FIGS. 17 and 18.

Figure 17:
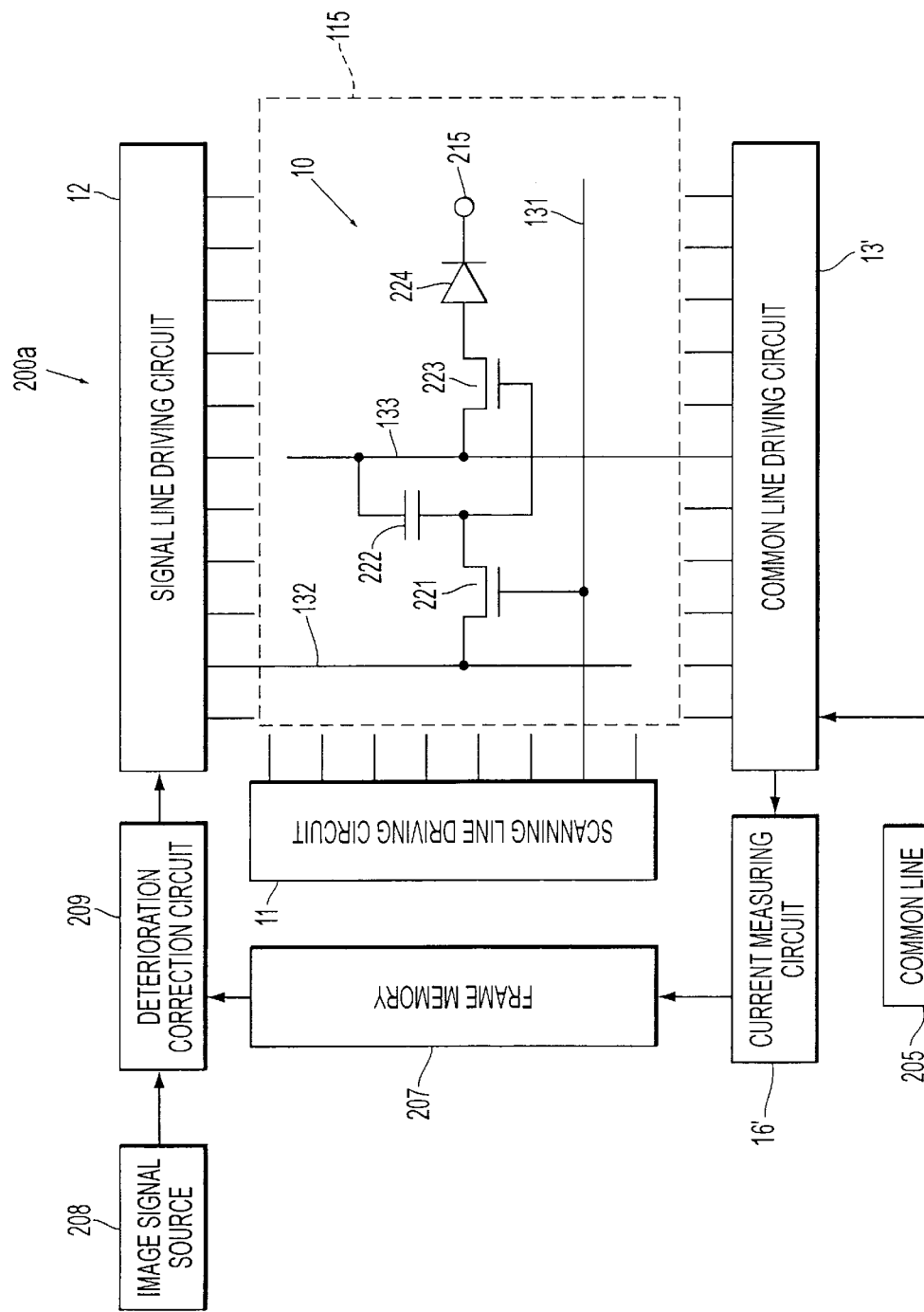
FIG. 17 is a block diagram showing an entire arrangement of a display apparatus according to the eleventh embodiment of the present invention including a circuit diagram for a pixel.
Figure 18:
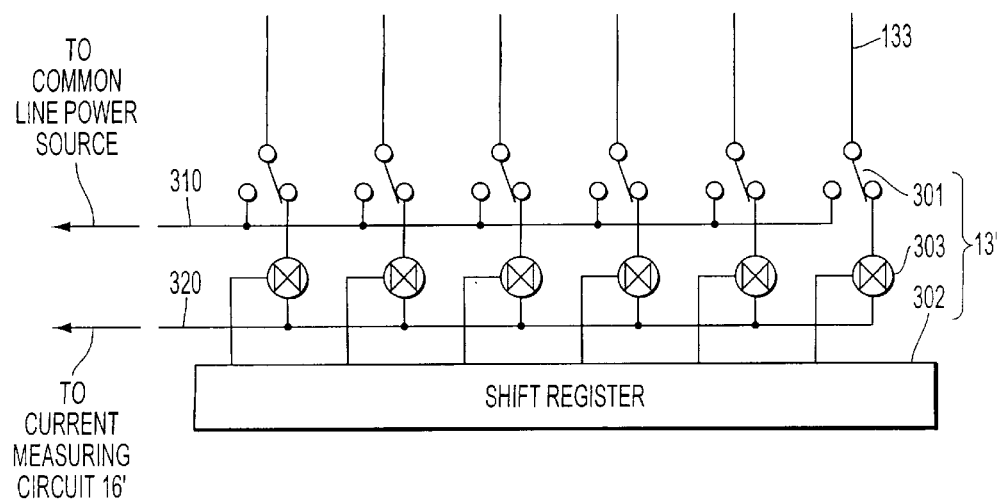
FIG. 18 is a circuit diagram of a common line driving circuit equipped with a display apparatus according to the eleventh embodiment of the present invention.

FIG. 17 is a block diagram of a display apparatus equipped with a TFT-OELD according to the eleventh embodiment of the present invention, and FIG. 18 is a block diagram of a common line driving circuit 13' provided for the display apparatus. In FIG. 17, a pixel circuit for only one pixel is depicted in a display region 115. However, actually the same pixel circuit is provided for each pixel.

In FIG. 17, the display apparatus 200$a$ according to the present embodiment further includes, in addition to the scanning line driving circuit 11 and the signal line driving circuit 12, a common line driving circuit 13' configured so as to be capable of supplying a power source signal separately to a plurality of common lines 133, a common line power source 205 for supplying power source to the common driving circuit 13', a frame memory 207 for storing measured current IDmn (m: the number of a signal line (1-M), n: the number of a signal line (l-N))of each of a plurality of pixels 10 in the display region 15 measured by the current measuring circuit 16' and a deterioration correcting circuit 209 arranged between an image signal source 208 and the signal line driving circuit 12. The deterioration correcting circuit 209 is configured to output the graduation level of an image signal input from the image signal source 208 to the signal line driving circuit 12 in order to correct a reduction in a quantity of driving current Id caused by deterioration over time in each of the plurality of pixels 10 after correcting it for each pixel 10 in accordance with each measured current IDmn stored in the frame memory 207.

Note that at least one of the common line driving circuit 13', the common line power source 205, the current measuring circuit 16', the frame memory 207, and the deterioration correcting circuit 209 may be formed on the TFT array substrate with the display region 115 provided in the center portion (see FIG. 1). Otherwise, it may be configured as an external IC to be externally mounted on the TFT array substrate.

In FIG. 18, the common line driving circuit 13' includes a changeover switch 301, a shift register 302 and a transmission switch 303.

The changeover switch 301, in the normal display operation, is switched to a power source wire 310 side which is connected to the common line power source 205 in such a manner that a power source signal of a predetermined voltage is supplied to a plurality of common lines 133 at the same time (that is, electric potentials of all common lines 133 are made equal) via the wire 310 under the control of the controller. On the other hand, the changeover switch 301 is, when correction is made for deterioration over time as will be described later (adjustment of a voltage of a power source signal supplied to each common line 133), configured so as to be able to be switched to a wire 320 side connected to the current measuring circuit 16' via the transmission switch 303 in such a manner that a measuring power source signal is serially supplied to a plurality of common lines 133 via the wire 320. The measuring power source signal may be supplied from the power source built-into the current measuring circuit 16' via the wire 320, or supplied using a power source of the common line power source 205 via the wire 320.

The transmission switch 303 transmits, when correction is made for deterioration over time, a measuring power source signal to the changeover switch 301 in response to a transfer signal sequentially output from the shift register 302, and the changeover switch 301 transmits the measuring power source signal to each pixel circuit via the common lines 133. At this time, the shift register 302 sequentially outputs the transfer signal in association with a plurality of common lines 133 under the control of the controller, not shown.

Next, an operation according to the present embodiment configured as described above will be explained.

First, when making a correction for deterioration over time, a measuring power source signal is sequentially supplied to a plurality of common lines 133 via each transmission switch 303 made transferable in response to a transfer signal sequentially output from the shift register 302. Then, a quantity of current of the measuring power source signal is measured for each common line 133. Here, since a scanning signal is sequentially supplied to each pixel 10 from the scanning line driving circuit 11, the measuring power source signal is made to flow as a driving current to the organic EL device 224 via the current TFT 223 for each pixel in a pixel row to which the power source signal is supplied from one common line 133. That is, a scanning signal is sequentially supplied from the scanning line driving circuit 11, while a measuring power source signal is supplied to the common line 133 in timing of a transfer signal by the shift resister 302, a driving current Id of each pixel 10 is measured by point-at-a-time scanning by the current measuring circuit 16'. Then, the quantity of measured current IDmn is stored in the frame memory 207.

Next, when a normal operation is carried out, an image signal from the image signal source 208 is transmitted to the deterioration correcting circuit 209. The deterioration correcting circuit 209 corrects a gradation level of the image signal for each pixel 10 in such a manner that the decrease of the current by deterioration over time is corrected in accordance with a degree of deterioration over time determined based upon a quantity of current IDmn (that is, a degree of reduction in a measured driving current versus a reference current) of each pixel 10 stored in the frame memory 207, and output to the signal line driving circuit 12. As a result, a change in a quantity of emitted light of the organic EL device 224 in each pixel 10 is corrected by variations of the gradation level by the deterioration correcting circuit 209. In carrying out a normal display operation, the changeover switch 301 of the common line driving circuit 203 is switched to the common line power source 205 side, and a predetermined electric potential is supplied to the common line 103.

In this embodiment, although current measurement is separately taken for all pixels 10, and the measured value IDmn is stored in the frame memory 207, current measurement may be made for some sampled pixels 10 or for an organized pixel block and then be stored. Besides, according to the present embodiment, with respect to all pixels 10, each pixel is differently corrected, for an organized pixel block or an entire panel block, correction may be made after some adequate processing.

According to the present embodiment, each TFT within each driving circuit, and each TFT within a pixel circuit, for example, are polycrystal silicon TFT formed through a lower-temperature process below 600 C., and each organic EL device 224 is formed, for example, by an ink-jet process.

(Twelfth Embodiment)

Figure 19:
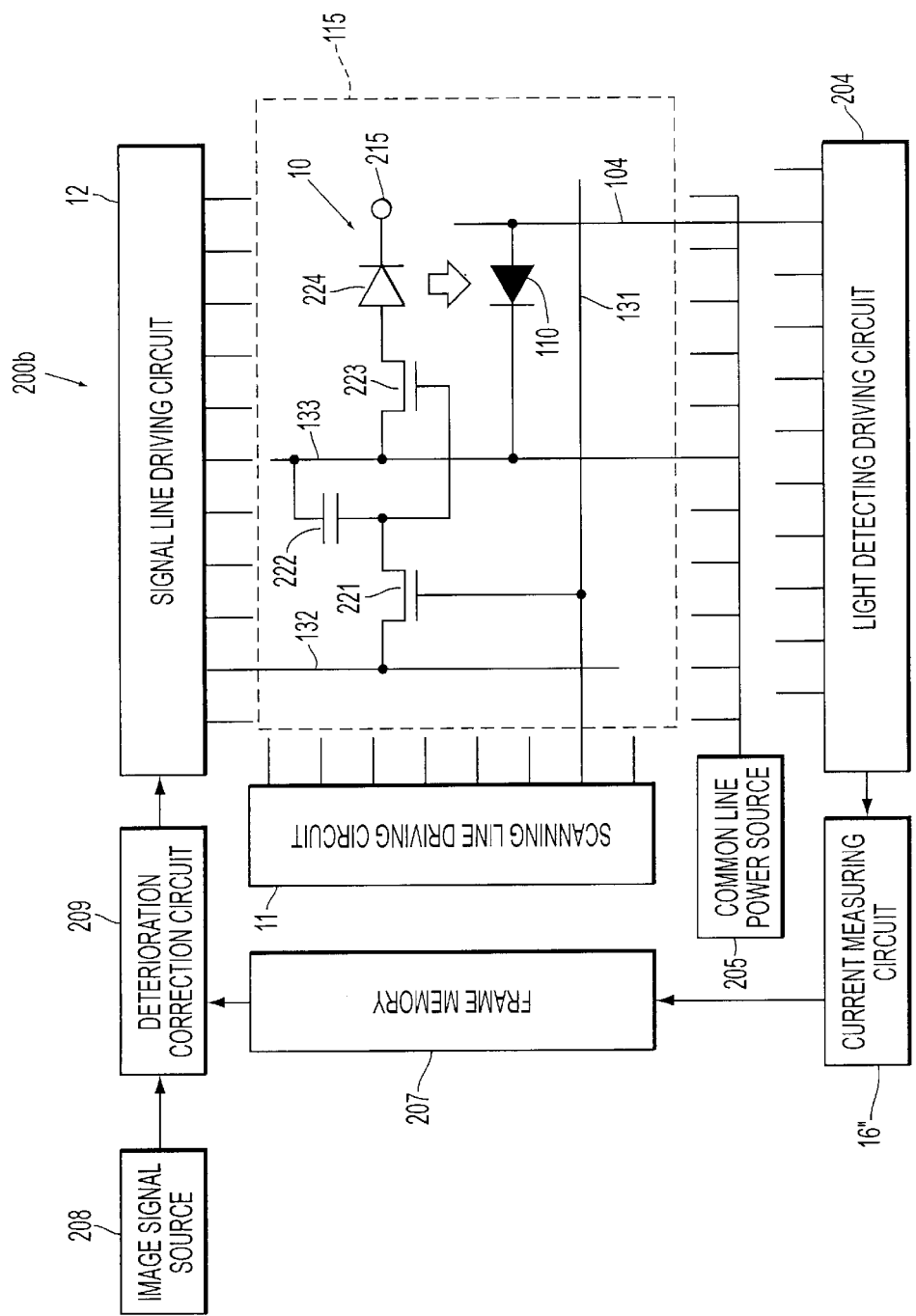
FIG. 19 is a block diagram showing an entire arrangement of a display apparatus according to the twelfth embodiment of the present invention including a circuit diagram of a pixel.
Figure 20:
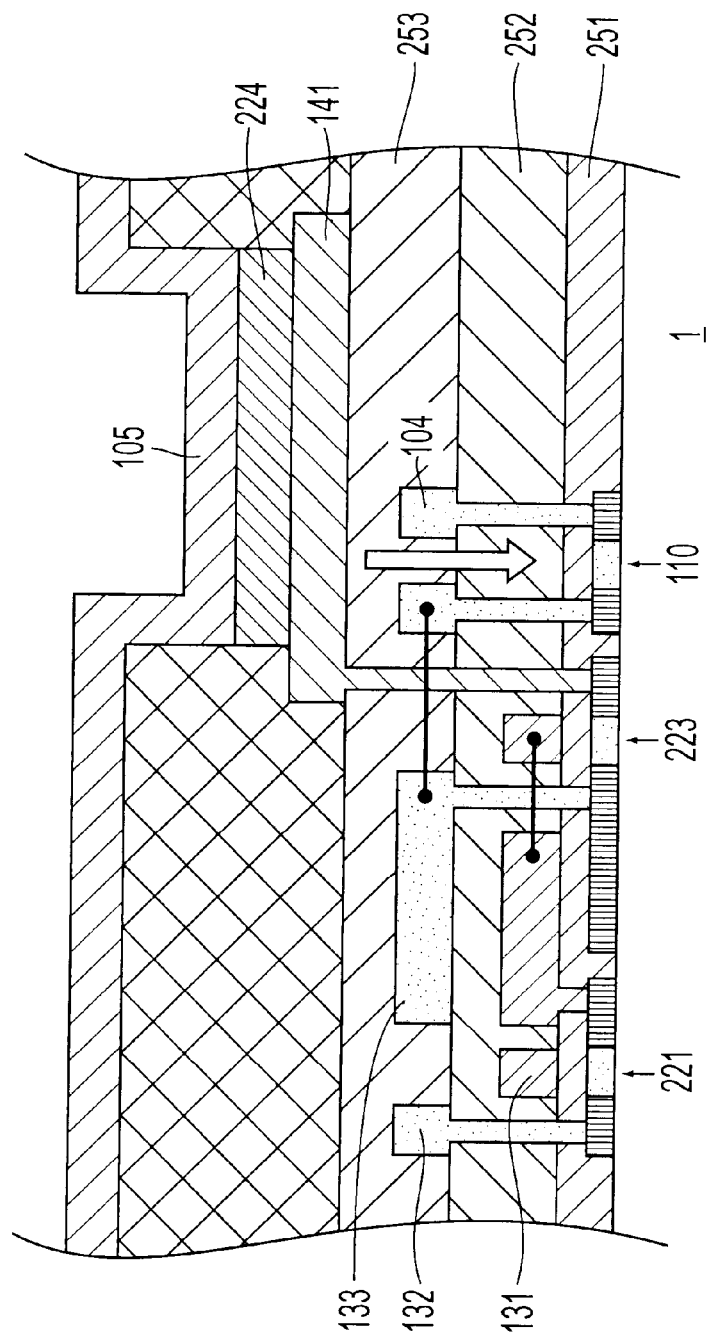
FIG. 20 shows a sectional view of a TFT-OELD portion equipped with a display apparatus according to the twelfth embodiment.

Next, the twelfth embodiment according to the present invention will be explained with reference to FIGS. 19 and 20. FIG. 19 is a block diagram of a display apparatus provided with a TFT-OELD according to the twelfth embodiment, and FIG. 20 is a cross sectional view of a pixel circuit provided for each pixel of the display apparatus. In FIG. 19, a circuit on one pixel only is shown in the display region 115. However, actually the same circuit is provided for each pixel. In addition, in FIG. 19, the same components as the eleventh embodiment shown in FIG. 11 are assigned the same reference symbols, and the description thereof is omitted.

In FIG. 19, a display apparatus 200b according to the present embodiment includes the scanning line driving circuit 11, the signal line driving circuit 12, the common line power source 205 for collectively supplying a power source signal of a predetermined electric potential to the common lines 133, a current measuring circuit 16", the frame memory 207, and the deterioration correcting circuit 209. The display apparatus 200b is especially equipped with a PIN diode 110 as one example of a quantity of emitted light measuring semiconductor element whose one edge is connected to a common line 133 in each of the pixel circuits, and a light detecting line 104 to cause a measuring. current to flow to the PIN diode 110 in parallel with a signal line 132 and a common line 133 is provided at the other edge of each PIN diode 110. Further, the display apparatus 200b is further provided with a light detecting line driving circuit 204 for driving a PIN diode 110 in each pixel via each light detecting line 104, and the current measuring circuit 16" measures a measuring current for each pixel 10 which flows to the PIN diode 110 driven by the light detecting line driving circuit 204. At least one of the light detecting driving circuit 204, the common line power source 205, the current measuring circuit 16", the frame memory 207, and the deterioration correcting circuit 209 may be formed on the TFT array substrate with the display region 115 provided at its center thereof (refer to FIG. 1), or may be configured as an external IC to be mounted on the TFT array substrate. Another example of a quantity of emitted light measuring semiconductor element instead of a PIN diode 110 is an FET (Field Effect Transistor) in which optical excitation current flows due to the fact that light enters into its channel portion.

As shown in FIG. 20, in the present embodiment, for each pixel 10, the PIN diode 110 is formed on the TFT array substrate 1 using the same semiconductor film used for the formation of the switching TFT 221 and the current TFT 223, and PIN junction formed by impurity doping. Additionally, a reverse bias voltage is applied to the PIN junction via the light detecting line 104 from the light detecting line driving circuit 204 in the same manner that an optical excitation current flows when light enters the PIN junction from the organic EL device 224 via interlayer insulating films 251–253. In addition, the gate of each TFT or the scanning line is composed of a metallic film such as Ta or a low resistance polysilicon film, and the signal line 132, the common line 133, and the light detecting line 104 are composed of a low resistance metallic film such as Al. In addition, the driving current flows through an opposing electrode 105 (an upper electrode) via the current TFT 223 by way of the EL device 224 from the pixel electrode 141 composed of such material as ITO. The composition of the opposing electrode 105 with a transparent material such as ITO enables the upper surface of the display apparatus 200a shown in FIG. 20 to be a display surface. On the other hand, the composition of the opposing electrode 105 with a metallic material of the light-reflective type or a light-shielding type such as Al enables the lower surface of the display apparatus 200b in FIG. 20 to be a display surface. Hereupon, it is assumed that the opposing electrode 105 includes Al as its main component.

Next, an operation according to the present embodiment configured described above will be explained.

First, when making correction for deterioration over time, the organic EL device 224 is made to emit light by supplying a scanning signal and a data signal for displaying a predetermined pattern from the scanning line driving circuit 11 and the signal line driving circuit 12. Then, since the opposing electrode 105 includes Al as its main component, the light is reflected and then radiated downward through the pixel electrode 141. At this time, since the PIN diode 110 reverse-biased by the light detecting line 104 is arranged in a portion of the optical path, an optical excitation current is generated in the PIN diode 110, the light reaches the light detecting line driving circuit 204 through the light detecting line 104. The light detecting line driving circuit 204 is, like the common line driving circuit 203 of the eleventh embodiment, provided with a plurality of transmission switches which sequentially supplies reverse-bias power source from the light detecting line 204 to the PIN diode 110 and sequentially supplies a measuring current to the current measuring circuit 16". As in the eleventh embodiment, the current measuring circuit 16" measures a measuring current for each pixel 10 by point-at-a-time. The quantity of emitted light of the organic EL device 224 provided for each pixel approximately increases, as the quantity of measured current IDmn' of the measuring current increases. Like the eleventh embodiment, storage by the frame memory 207 corresponding to the quantity of measured current IDmn' (measured quantity of emitted light) and correction by the deterioration correcting circuit 209 are also carried out.

Figure 21A:
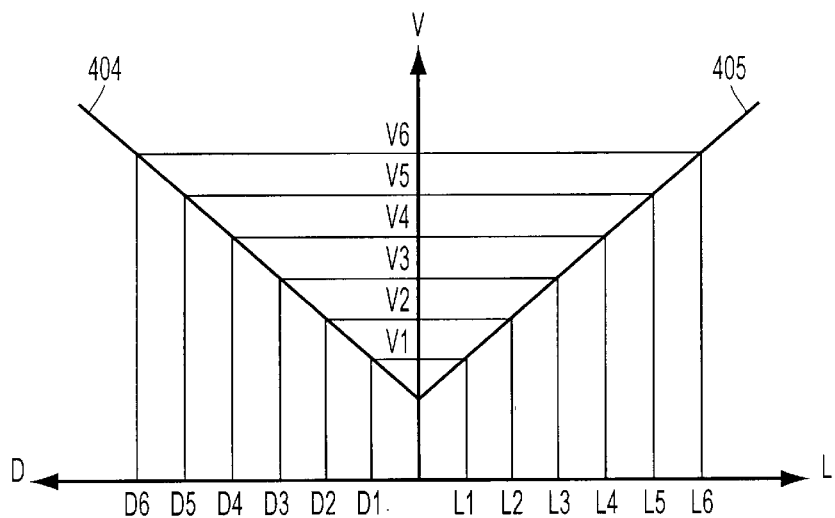
FIGS. 21(a)–(b) are a characteristic diagram showing a way of correcting deterioration in a display apparatus according to the twelfth embodiment.
Figure 21B:
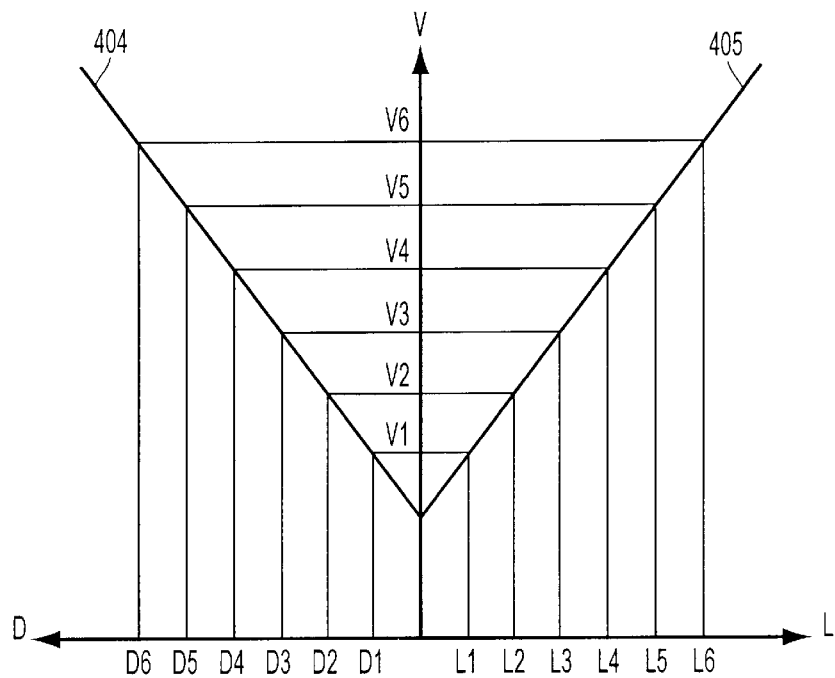

More specifically, as shown in FIGS. 21(a)–(b) a deterioration correcting method in the eleventh embodiment will be carried out.

That is, first, in the initial state, as shown in FIG. 21(a), the deterioration correcting circuit 209 does not make correction, and thus the signal line driving circuit 12 outputs data signals of signal levels V1, V2, . . . ,V6 in accordance with gradation levels D1, D2, . . . ,D6 of an image signal of image signal source 208 to a signal conversion curve 404. This data signal is applied to the gate electrode of the current TFT 223 from the signal line driving circuit 12 the signal line 132, the switching TFT 221, and the retention capacitor 222. As a result, luminescence can be obtained from the organic EL device 224 with luminescence levels L1, L2, L3, . . . ,L6 corresponding to a luminescence characteristic curve 405 that shows a relation of an electric potential applied to the gate electrode of the current TFT 223 and a quantity of emitted light of the organic EL device 224. Note that, hereupon consideration is given to the fact that the organic EL device 224 begins to emit light when a signal level $V_b$ exceeds a certain threshold voltage.

Next, as shown in FIG. 21(b), luminescence characteristic curve 405 changes in the state which the quantity of emitted light has changed according to deterioration over time of the organic EL device 224 and the current TFT 223. This luminescence characteristic curve 405 is obtained by the measurement of the quantity of emitted light using for example the light detecting driving circuit 204 and the current measuring circuit 16" in the correction processing described above. An adequate signal conversion curve 404 is set in the deterioration correcting circuit 209 based upon this luminescence characteristic curve 405.

Thereafter, during a normal display period, the deterioration correcting circuit 209 carries out adjustment that, for gradation levels D1, D2, . . . , D6, image signals of signal levels V1, V2, . . . , V6 are output from the signal line driving circuit 12 using this signal conversion curve 404. This results in obtaining the same quantity of emitted light before deterioration and after deterioration in accordance with post-deterioration luminescence characteristic curve 405 at each pixel 10. In this embodiment, a threshold voltage for the luminescence of the organic EL device 224 also has taken into consideration.

According to the twelfth embodiment as described above, a quantity of emitted light of the organic EL device 224 in each pixel is measured using the PIN diode 110, and thus a reduction in quantity of emitted light by deterioration can be more precisely corrected compared to the eleventh embodiment.

In this embodiment, although measurement of a quantity of emitted light is separately taken for all pixels 10, and the measured value is stored in the frame memory 207, measurement of a quantity of emitted light may be made for some sampled pixels 10 or for an organized pixel block and the measured value may be stored. Besides, according to the present embodiment, with respect to all pixels 10, each pixel is individually corrected, for an organized pixel block or for an entire panel block, and correction may be made after some adequate processing.

In the present embodiment, the PIN diode 110 is used as a monitoring light-intercepting device causing an optical excitation current, however, a semiconductor element such as an field effect transistor can be used. In this case, as an electric potential applied to a gate electrode of a field effect transistor, the potential, which effectively creates optical excitation current, is selected. Further, since emitted light from an organic EL device 224 reaches a channel, a suitable configuration is selected from a top-gate type, a square-staggered type, a reverse-staggered type, a channel etch type, and a channel stopper type, and a gate electrode is likely to be configured with ITO. Furthermore, in the present embodiment, a TFT formed in each driving circuit or each pixel circuit and a PIN diode as a semiconductor element generating an optical excitation current are preferably formed on an identical process. This eliminates the process of separately forming a PIN diode, thus being advantageous.

(Thirteenth Embodiment)

Figure 22A:
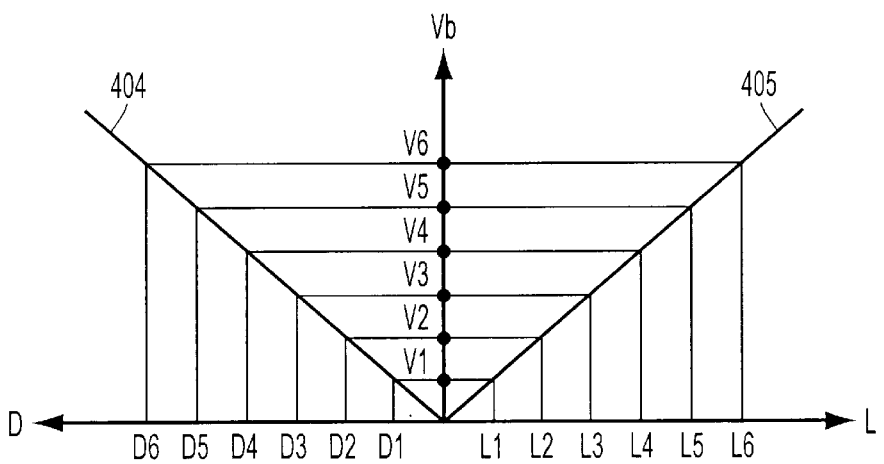
FIGS. 22(a)–(b) are a characteristics diagram showing a way of correcting deterioration in a display apparatus according to the thirteen embodiment of the present invention.
Figure 22B:
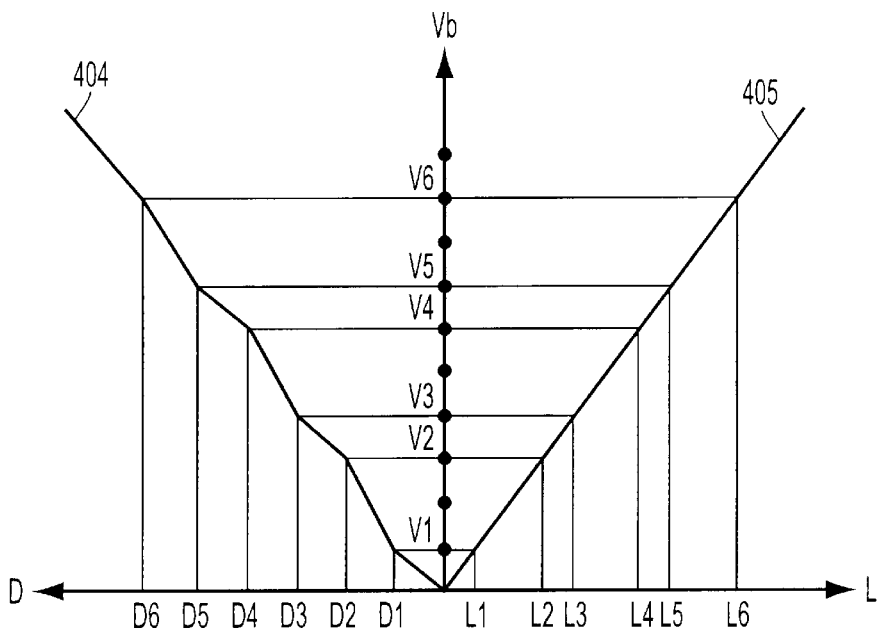

FIGS. 22(a)–(b) show a deterioration correcting method provided for a display apparatus equipped with a TFT-OELD according to the thirteenth embodiment of the present invention. The hardware configuration of the display apparatus according to the thirteenth embodiment is the same as that in the eleventh or twelfth embodiments, and the description thereof is omitted.

The thirteenth embodiment is different from the twelfth embodiment in a setting method of the signal conversion curve 404 based on the luminescence characteristic curve 405 obtained from a measurement of a quantity of emitted light in the deterioration correcting circuit 209 explained with reference to FIGS. 21(a)–(b).

In the thirteenth embodiment, a voltage value in a data signal is adjusted by converting a certain specified signal level to another specified signal level. That is, in FIG. 21(b) corresponding to a case where a quantity of emitted light decreases due to deterioration of the organic EL device 224, by selecting a corrected signal levels V1, V2, ..., V6 of the data signal from among digitized electric potentials predetermined due to restriction resulting from power source of the signal line driving circuit 12, signal conversion curve 404 is set against luminescence characteristic curve 405. This impairs the linearity of the quantity of emitted light although, since gradation is not reversed, and favorable gradation can be obtained when viewed by the naked eyes.

As described above, according to the thirteenth embodiment, in the signal line driving circuit 12, a reduction in a quantity of emitted light caused by deterioration over time can be corrected using a power source having limited kinds of electric potentials.

In the embodiments from the first embodiment to the thirteenth embodiment, a pixel circuit is configured with a switching TFT. However, for example, by directly supplying a scanning signal to a gate of the driving TET from a scanning line and a data signal to a source of the driving TFT from a signal line, a data signal is supplied to the organic EL device via the source and the drain of the driving TFT. By thus doing, the organic EL device may be driven. That is, in this case, a decrease in a driving current and a quantity of emitted light due to deterioration over time in an organic EL device and a driving TFT equipped in each pixel circuit can be corrected by the present invention. Further, a switching TFT equipped in each pixel circuit may be configured from an n-channel type TFT or a p-channel type TFT on condition that a voltage polarity of a scanning signal causal to the gate is adjusted.

(Electronic Apparatus)

Next, an embodiment of an electronic apparatus provided with a display apparatus explained in detail in each of the foregoing embodiments will be explained with reference to FIG. 23 through FIG. 25.

Figure 23:
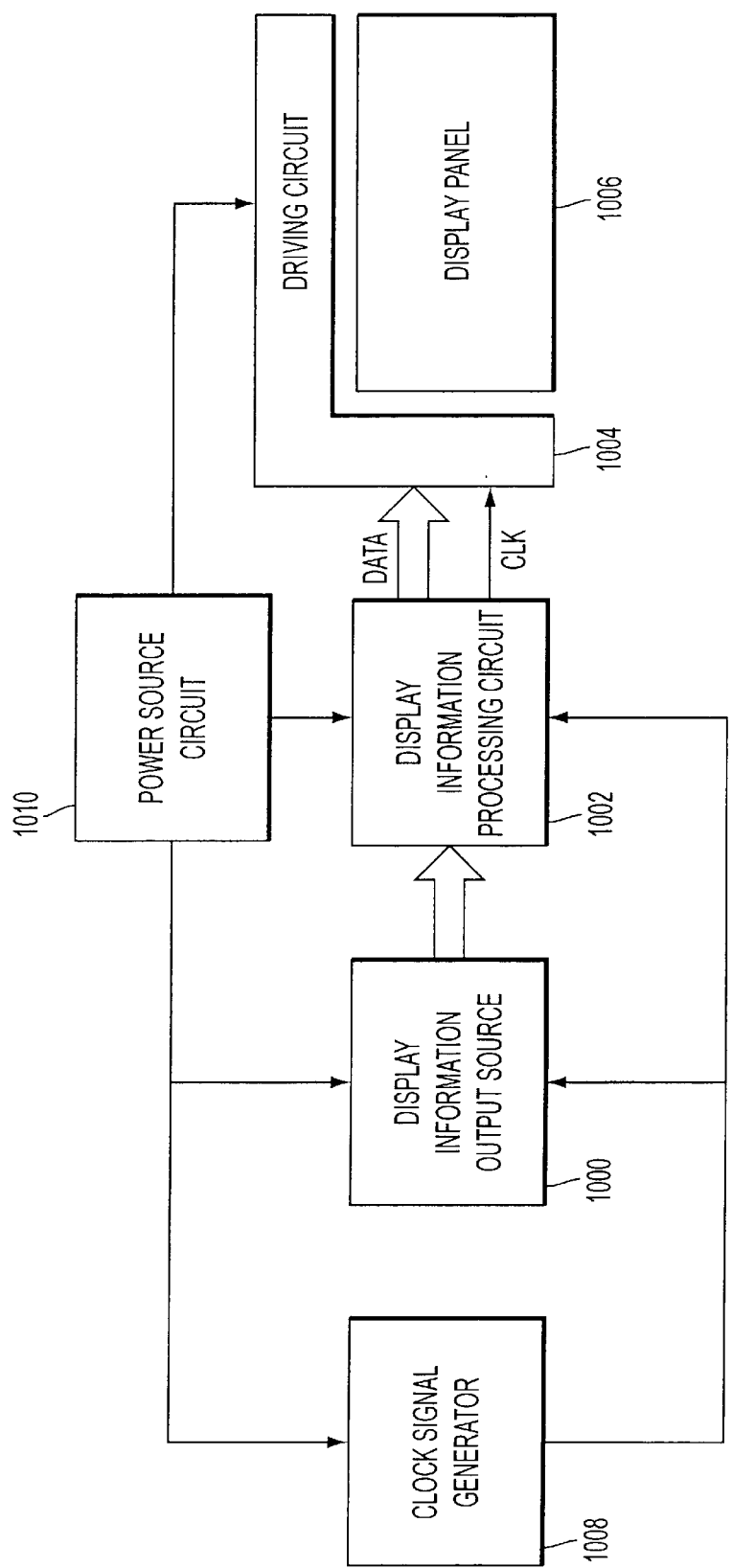
FIG. 23 is a block diagram showing an outlined arrangement of mode for carrying out an electronic apparatus according to the present invention.

First, FIG. 23 shows an schematic structure of an electronic apparatus provided for such a display apparatus.

In FIG. 23, an electronic apparatus includes a display information output source 1000, a display information processing circuit 1002, a driving circuit 1004, a display panel 1006, a clock generating circuit 1008, and a power source circuit 1010. The display apparatus in each embodiment described above corresponds to the display panel 1006 and the driving circuit 1004 according to the present invention. Consequently, the driving circuit 1004 may be built-in on a TFT array substrate constituting the display panel 1006. Further, such as the display information processing circuit 1002 may be built-in on a TFT array substrate constituting the display panel 1006. Otherwise, the driving circuit 1004 is externally mounted on the TFT array substrate with the display panel 1006 loaded thereto.

The display information output source 1000 includes a ROM (Read Only Memory), a RAM (Random Access Memory), a storage unit such as an optical disk device and a tuning circuit which outputs a tuned television signal, and outputs display information such as a predetermined format image signal to a display information processing circuit 1002 based on a clock signal from the clock generating circuit 1008.

The display information processing circuit 1002 is composed of well-known processing circuits of several kinds such as an amplification inversion circuit, a phase expansion circuit, a rotation circuit, a gamma-correction circuit, and a clamping circuit. The display information processing circuit 1002 sequentially generates a digital signal from display information input based on a clock signal and outputs them along with the clock signal CLK to the driving circuit 1004. The driving circuit 1004 drives a display panel 200. The power source circuit 1010 supplies a predetermined power source to each circuit described above.

Figure 24:
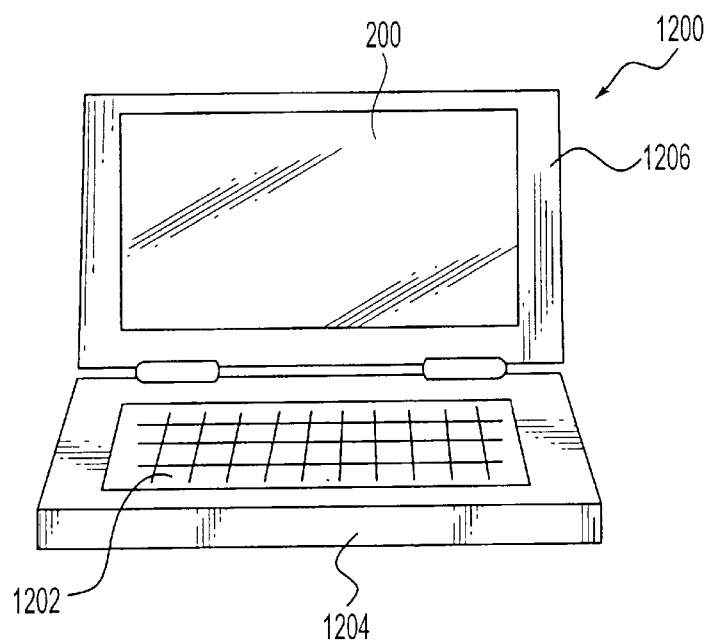
FIG. 24 is a front view of a personal computer as an example of electronic apparatuses.
Figure 25:
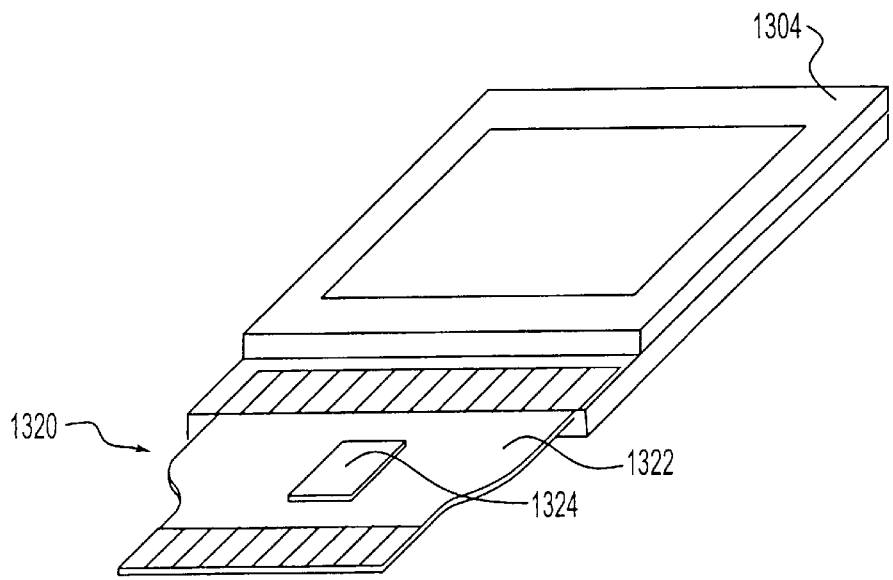
FIG. 25 is a perspective view of a display apparatus with TCP as another example of the electronic apparatuses.

Next, FIGS. 24 and 25 each show an embodiment of an electronic apparatus configured as described above. In FIG. 24, a lap-top type personal computer (PC) 1200 ready for multi-media, which is another example of an electronic apparatus, includes the display panel 200 described above equipped within a top cover case 1206, and further accommodates a CPU, a memory, a modem, etc. and is provided with a product body 1204 having a keyboard 1202 incorporated therein.

Additionally, as shown in FIG. 25, in the case of a display panel 1304 without the driving circuit 1004 or the display information processing circuit 1002, an IC 1324 including the driving circuit 1004 or the display information processing circuit 1002 physically and electrically connects to a TCP(Tape Carrier Package) mounted on a polyimide tape 1322 via an anisotropic conductive film provided around a TFT array substrate 1 and is capable of being manufactured, sold, and used as a display panel.

Other than the electronic apparatus explained with reference to FIGS. 24 and 25, an apparatus equipped with a television, a view finder type or a monitor direct-viewing type videotape recorder, a car navigation equipment, an electronic notebook, an electronic calculator, a word processor, an engineering workstation (EWS), a portable telephone, a television telephone, a POS terminal, a touch panel are given as examples of an electronic apparatus shown in FIG. 23.

As explained above, according to the present embodiment, several kinds of an electronic apparatus, which can carry out high quality screen display without being badly affected by deterioration over time of a current driving type light-emitting device of such as an organic EL device or a driving current of such as a current TFT over a long period of time, can be realized.

Industrial Applicability

A display apparatus according to the present invention can be used as a display apparatus provided with several kinds of current driving type light-emitting devices such as an organic EL device, an inorganic EL device, a light emitting polymer, an LED, and driving device such as a TFT for driving those. Further, a pixel circuit according to the present invention can be used for a display apparatus having therein several types of active matrix driving methods. Additionally, an electronic apparatus according to the present invention is configured using a pixel circuit and a display apparatus of this kind and is used for an electronic apparatus and so forth which performs high quality screen display over a long period of time.

What is claimed is:

1. A display apparatus, comprising:
   a current driving type light-emitting device provided for each pixel;
   a driving device provided for each of said pixels that controls a driving current flowing to said light-emitting device;
   a power source unit that supplies a power source voltage through a power wire to cause said driving current to flow to said light-emitting device via said driving device;
   a signal wire driving unit that supplies a data signal having a voltage to said driving device through a signal wire, said driving device controlling said driving current in accordance with the voltage with said data signal; and
   a voltage adjusting unit that adjusts at least one of said power source voltage of said power source unit and said data signal at said signal wire driving unit, in such a manner that, when a data signal of a predetermined voltage is supplied to said driving device through said signal wire, at least one of a quantity of driving current flowing and a quantity of light emitted by said light-emitting device comes close to a predetermined reference value.

2. The display apparatus according to claim 1,
   said driving device comprising a thin film transistor having a gate to which said data signal is supplied, and a source and a drain between which said driving current flows, a conductance between said source and said drain being controlled by a gate voltage.

3. The display apparatus according to claim 1,
   said voltage adjusting unit comprising: a current measuring unit that measures a quantity of driving current when a data signal of said predetermined voltage is supplied to said driving device; and a voltage control unit that adjusts at least one of said power source voltage and said data signal voltage such that said measured current approaches a predetermined reference current.

4. The display apparatus according to claim 1,
   said voltage adjusting unit comprising: a light-emitting measuring unit that measures the quantity of said emitted light at the time when a data signal of said predetermined voltage is supplied to said drive device; and a voltage control unit that adjusts at least one of said power source voltage and said data signal voltage such that said measured quantity of emitted light approaches said reference quantity of emitted light.

5. The display apparatus according to claim 1, further comprising a controller that controls said voltage adjusting unit so as to adjust at least one of said power source voltage and said data signal voltage at a non-display period preceding a display period.

6. A display apparatus, comprising:
   a current driving type light-emitting device for each pixel;
   a power source unit that supplies a power source voltage through a power wire to cause a driving current to flow through said current driving type light-emitting device;
   a signal wire driving unit that supplied a data signal to said current driving type light-emitting device;
   a voltage adjusting unit that adjusts at least one of said power source voltage of said power source unit and said data signal at said signal wire driving unit, in such manner that, when a data signal of predetermined voltage is supplied to said current driving type light-emitting device, at least one of a quantity of driving current flowing through said current driving type light-emitting device and a quantity of light emitted by said light-emitting device comes close to a predetermined reference value.

7. The display apparatus according to claim 6, further comprising a driving device provided for each pixel that controls driving current flowing to said current driving type light-emitting device.

8. A display apparatus, comprising:
   a current driving light-emitting device provided for each pixel;
   a driving device provided for each pixel that controls a driving current flowing to the light-emitting device;
   a power source unit that supplies a power source voltage through a power wire to cause the driving current flow to the light-emitting device via the driving device;
   a signal wire driving unit that supplies a data signal having a voltage to the driving device through a signal wire, the driving device controlling the driving current in accordance with the data signal; and
   a voltage adjusting unit that adjusts at least one of the power source voltage of the power source unit and the data signal at the signal wire driving unit based upon at least a measurement result at a measuring unit, the measuring unit for measuring at least one of a quantity of driving current flowing through the light-emitting device and a quantity of a light emitted by the light-emitting device.

9. The display apparatus according to claim 8, wherein:
   the measuring unit being a current measuring unit that measures a quantity of driving current through the light-emitting device when a data signal of a predetermined voltage is supplied to the driving device.

10. The display apparatus according to claim 8, wherein:
    the measuring unit is a light-emitting unit that measures a quantity of a light emitted by the light-emitting device.

11. The display apparatus according to claim 8, further comprising:
    a controller that controls the voltage adjusting unit so as to adjust at least one of the power source voltage and the data signal at a non-display period.

12. The display apparatus according to claim 8, wherein:
    the voltage adjusting unit adjusting the at least one of the power source voltage of the power source unit and the data signal at the signal wire driving unit in such a manner that a difference between the measurement value and the predetermined reference value is obtained, the measurement value being obtained when a predetermined data signal is supplied to the driving device through the signal wire.

13. A display apparatus, comprising:
    a plurality of current driving light-emitting devices, each of which is provided for each pixel;
    a power source unit that supplies a power source voltage through a power wire to cause the driving current to flow to the light-emitting device via the driving device;
    a signal wire driving unit that supplies a data signal to the driving device through a signal wire, the driving device controlling the driving current in accordance with the data signal; and an adjusting unit that adjusts at least one of the power source voltage of the power source unit and the data signal at the signal wire driving unit based upon at least a measurement result at a measuring unit, the measuring unit for measuring at least one of a quantity of a driving current flowing through a predetermined light-emitting device of the light-emitting devices and a quantity of a light emitted by a predetermined light-emitting device of the light-emitting devices.

14. The display apparatus according to claim 13, further comprising:

a driving device provided for each pixel that controls a driving current flowing to the light-emitting device.

15. A display apparatus, comprising:

a plurality of current driving light-emitting devices, each of which is provided for each pixel;

a driving device provided for each pixel that controls a driving current flowing to the light-emitting device;

a power source unit that supplies a power source voltage through a power wire to cause the driving current to flow to the light-emitting device via the driving device;

a signal wire driving unit that supplies a data signal having a voltage to the driving device through a signal wire, the driving device controlling the driving current in accordance with the data signal; and a voltage adjusting unit that adjusts at least one of the power source voltage of the power source unit and the data signal at the signal wire driving unit based upon comparison results of a comparison circuit that compares a measurement value by a measuring unit to a predetermined reference value, the measuring unit measures at least one of a quantity of driving current flowing through a predetermined light-emitting device of the light-emitting devices and a quantity of light emitted by a predetermined light-emitting device of the light-emitting devices.

16. The display apparatus according to claim 15, wherein:

the voltage adjusting the at least one of the power source voltage of the power source unit and the data signal at the signal wire driving unit in such a manner that a difference between the measurement value and the predetermined reference vaule is obtained, the measurement value being obtained when a predetermined data signal is supplied to the driving device through the signal wire.

17. A display apparatus, comprising:

a current driving light-emitting device provided for each pixel;

a driving device provided for each pixel that controls a driving current flowing to the light-emitting device;

a power source unit that supplies a power source voltage through a power wire to cause the driving current to flow to the light-emitting device via the driving device;

a signal wire driving unit that supplies a data signal having a voltage to the driving device through a signal wire, the driving device controlling the driving current in accordance with the data signal; and a voltage adjusting unit that adjusts at least one of the power source voltage of the power source unit and the data signal at the signal wire driving unit based upon comparison results of a comparison circuit that compares measured current by a current measuring unit to a predetermined reference current, the measuring unit measures a quantity of driving current flowing through a predetermined light-emitting device of the light-emitting devices.

18. A display apparatus, comprising:

a current driving light-emitting device provided for each pixel;

a driving device provided for each pixel that controls a driving current flowing to the light-emitting device;

a power source unit that supplies a power source voltage through a power wire to cause the driving current to flow to the light-emitting device via the driving device;

a signal wire driving unit that supplies a data signal having a voltage to the driving device through a signal wire, the driving device controlling the driving current in accordance with the data signal; and a voltage adjusting unit that adjusts at least one of the power source voltage of the power source unit and the data signal at the signal wire driving unit based upon comparison results of a comparison circuit that compares a quantity of emitted light from the light-emitting device by a quantity-of-emitted-light measauring unit to a predetermined reference quantity of emitted light, the quantity-of-emitted-light measuring unit measures a quantity of light by the light-emitting device.

19. A display apparatus, comprising:

a current driving light-emitting device provided for each pixel;

a driving device provided for each pixel that controls a driving current flowing to the light-emitting device;

a power source unit that supplies a power source voltage through a power wire to cause the driving current to flow to the light-emitting device via the driving device;

a signal wire driving unit that supplies a data signal to the driving device through a signal wire, the driving device controlling the driving current in accordance with the data signal; and a voltage adjusting unit that increases the power source voltage of the power source unit compared to an initially set power source voltage of the power source when the light-emitting device or the driving device suffers a deterioration over time.

20. The display apparatus according to claim 18, wherein:

the deterioration of the light-emitting device or the driving device being determined by a measuring unit, the measuring unit measures at least one of a quantity of driving current flowing through the light-emitting device and a quantity of a light emitted by the light-emitting device.

* * * * *